United States Patent [19]
Nakase

[11] Patent Number: 5,774,410
[45] Date of Patent: Jun. 30, 1998

[54] SEMICONDUCTOR STORAGE DEVICE

[75] Inventor: Yasunobu Nakase, Tokyo, Japan

[73] Assignee: Mitsubishi Denki Kabushiki Kaisha, Tokyo, Japan

[21] Appl. No.: 916,010

[22] Filed: Aug. 21, 1997

Related U.S. Application Data

[63] Continuation of Ser. No. 751,160, Nov. 15, 1996, abandoned.

[30] Foreign Application Priority Data

May 8, 1996 [JP] Japan ..................................... 8-113592

[51] Int. Cl.$^6$ .................................................. G11C 8/00
[52] U.S. Cl. ................................ 365/230.05; 365/230.03
[58] Field of Search .......................... 365/230.05, 230.03, 365/189.04, 203

[56] References Cited

U.S. PATENT DOCUMENTS 5,574,687  11/1996  Nakase ................................. 365/189.06

FOREIGN PATENT DOCUMENTS 60-111394  6/1985  Japan .
5-166375  7/1993  Japan .

OTHER PUBLICATIONS

1993 IEEE International Solid–State Circuits Conference, pp. 250–251, 1993, Katsuro Sasaki, et al., "A 16MB CMOS SRAM With A 2.3 $\mu m^2$ Single–Bit Line Memory Cell".

1993 IEEE International Solid–State Circuits Conference, pp. 252–253, 1993, Motomu Ukita, et al., "Single Bitline Cross–Point Cell Activation (SCPA) Architecture for Ultra Low Power SRAMS".

1991 IEEE Custom Integrated Circuits Conference, pp. 3.4.1–3.4.4., 1991, Satoshi Shinagawa, et al., "A Multi–Speed Digital Cross–Connect Switching VLSI Using New Circuit Techniques in Dual Port RAMS".

*Primary Examiner*—Son T. Dinh
*Attorney, Agent, or Firm*—Oblon, Spivak, McClelland, Maier & Neustadt, P.C.

[57] ABSTRACT

It is an object to obtain a semiconductor storage device with two-port structure enabling reduction in circuit area. A crossbar switch CBS_i (i=1–5) outputs a control signal for a zeroth port PORT_0 from an output portion CS_i0 and outputs a control signal for a first port PORT_1 from an output portion CS_i1 when a port exchange signal PSEL is at an L level, and outputs a control signal for the zeroth port PORT_0 from the output portion CS_i1 and outputs a control signal for the first port PORT_1 from the output portion CS_i0 when the port exchange signal PSEL is at an H level, thereby performing a port switching operation.

21 Claims, 14 Drawing Sheets

FIG. 5

F I G. 1 5
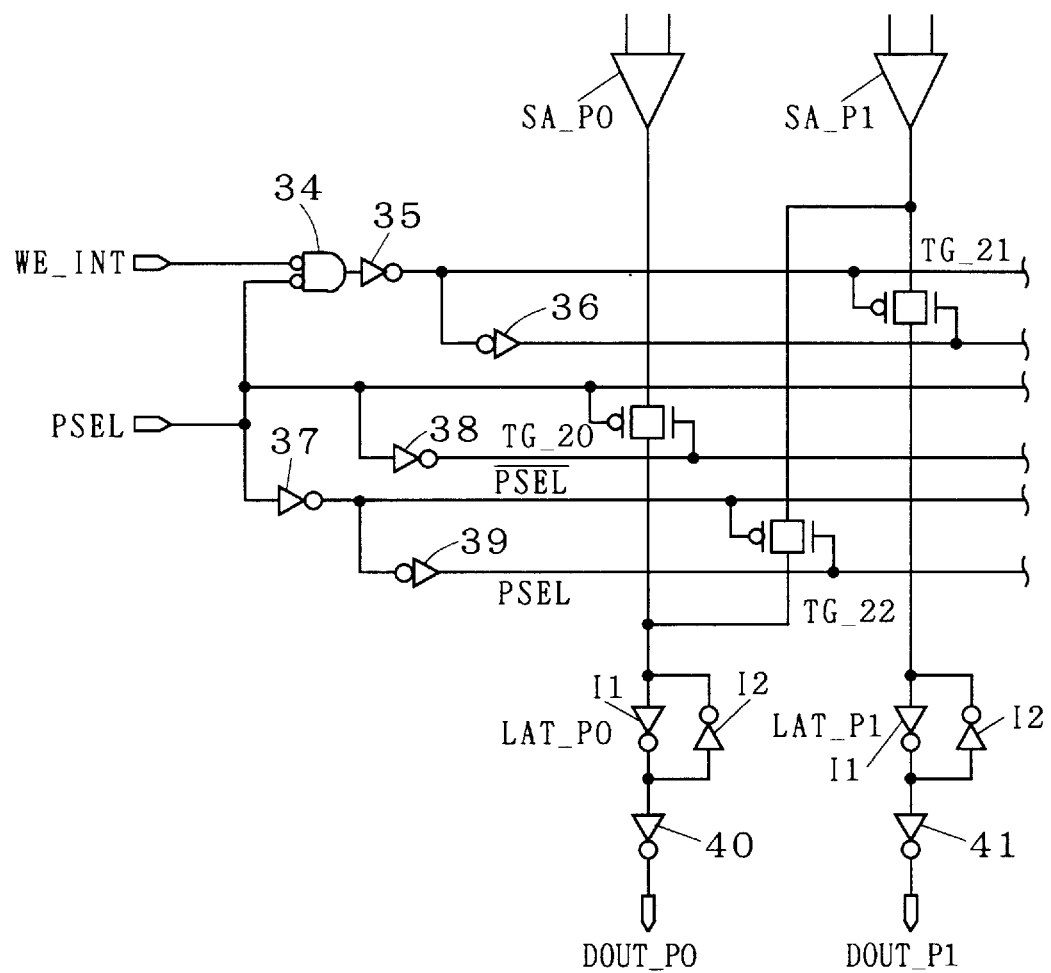

SEMICONDUCTOR STORAGE DEVICE

This application is a Continuation of application Ser. No. 08/751,160, filed on Nov. 15, 1996, now abandoned.

BACKGROUND OF THE INVENTION

1. Field of the Invention

The present invention relates to a semiconductor storage device having a dual port function suitable for transfer of a large capacity of data between a plurality of processors.

2. Description of the Background Art

A dual port memory means a memory which has two ports and allows read, write, or both read and write to or from each of the ports. A dual port memory is discussed herein which has one of its ports for reading only and the other for both reading and writing.

FIG. 16 is a circuit diagram showing the conventional structure of a dual port memory. The zeroth (0th) port (PORT_0) is a read-only port and the first port (PORT_1) is a read/write port.

WORD_00 to WORD_11 are word lines, WORD_P0<0> and WORD_P0<1> are word line selection signals for the zeroth port PORT_0, and WORD_P1<0> and WORD_P1<1> are word line selection signals for the first port PORT_1. BIT_P0 and BITB_P0 are a bit line pair of the zeroth port PORT_0 and BIT_P1 and BITB_P1 are a bit line pair of the first port PORT_1. PRC_P0 and PRC_P1 are bit line precharge signals for the zeroth port PORT_0 and the first port PORT_1, respectively. The precharge signals PRC_P0 and PRC_P1 are signals on which the respective port operations are based, which are equivalent to clocks. RSEL_P0 is a bit line selection signal for the zeroth port PORT_0, RSEL_P1 is a bit line selection signal for use in reading of the first port PORT_1 and WSEL_P1 is a bit line selection signal for use in writing of the first port PORT_1.

SA_P0 and SA_P1 are sense amplifiers for the zeroth port PORT_0 and the first port PORT_1, respectively, which output output signals DOUT_P0 and DOUT_P1, respectively. WB_P1 is a write buffer of the first port PORT_1, which drives the bit line pair BIT_P1, BITB_P1 of the first port PORT_1 when writing according to an input signal DIN_P1.

MC0 and MC1 are memory cells, each memory cell MC0, MC1 being composed of two inverters INV0 and INV1 and four NMOS transistors NM0—NM3. In the memory cell MCi (i=0, 1), the inverters INV0 and INV1 are loop connected, with the input portion of the inverter INV0 (the output portion of the inverter INV1) defined as a node Ni0 and the output portion of the inverter INV0 (the input portion of the inverter INV1) defined as a node Ni1, the node Ni0 being connected to the bit line BIT_P0 through the NMOS transistor NM0 and connected to the bit line BIT_P1 through the NMOS transistor NM2, the node Ni1 being connected to the bit line BITB_P0 through the NMOS transistor NM1 and connected to the bit line BITB_P1 through the NMOS transistor NM3. The NMOS transistors NM0 and NM1 have their respective gates connected to the word line WORD_i0 and the NMOS transistors NM2 and NM3 have their respective gates connected to the word line WORD_i1.

One end of the bit line BIT_P0 is connected to a power supply VDD through a PMOS transistor MP0 and its other end is connected to one input to the sense amplifier SA_P0 through a PMOS transistor PM4. One end of the bit line BITB_P0 is connected to the power supply VDD through a PMOS transistor PM1 and its other end is connected to the other input of the sense amplifier SA_P0 through a PMOS transistor PM5. One end of the bit line BIT_P1 is connected to the power supply VDD through a PMOS transistor PM2 and its other end is connected to one input of the sense amplifier SA_P1 through a PMOS transistor PM6 and also connected to an output portion of the write buffer WB_P1 through an NMOS transistor NM4. One end of the bit line BITB_P1 is connected to the power supply VDD through a PMOS transistor PM3 and its other end is connected to the other input of the sense amplifier SA_P1 through a PMOS transistor PM7 and also connected to the inversion output portion of the write buffer WB_P1 through an NMOS transistor NM5.

The PMOS transistors MP0 and PM1 receive the precharge signal PRC_P0 at their gates and the PMOS transistors PM2 and PM3 receive the precharge signal PRC_P1 at their gates. The PMOS transistors PM4 and PM5 receive the reading bit line selection signal RSEL_P0 at their gates, the PMOS transistors PM6 and PM7 receive the reading bit line selection signal RSEL_P1 at their gates and the NMOS transistors NM4 and NM5 receive the writing bit line selection signal WSEL_P1 at their gates.

FIG. 16 shows only two memory cells for convenience, but a large number of memory cells are connected to each word line and bit line pair in practice.

Next, operation will be described. FIG. 17 is a timing chart showing time series change of each signal of the dual port memory. FIG. 17 shows an example in which the zeroth port PORT_P0 selects the memory cell MC0 and the first port PORT_1 selects the memory cell MC1. At an L level, the precharge signals PRC_P0 and PRC_P1 precharge potentials on bit lines of the ports to an H level. The word lines WORD are set so that they attain a selection state (H level) when corresponding precharge signals PRC are at an H level. The bit line selection signals are also set so that they attain a selection state when the precharge signal is at the H level. L levels of the reading bit line selection signals RSEL_P0 and RSEL_P1 correspond to a selection state and an H level of the writing bit line selection signal WSEL_P1 corresponds to a selection state.

Since the zeroth port PORT_0 is a read-only port, the word line selection signal WORD_P0<0> attains an H level and the bit line selection signal RSEL_P0 goes to an L level when the precharge signal PRC_P0 is at the H level. At this time, the memory cell MC0 is selected and its data is outputted to the bit line pair BIT_P0 and BITB_P0. If it is assumed that the data was held with the node N00 of the memory cell MC0 at an H level and the node N01 at an L level, then the bit line BIT_P0 is held unchanged at the H level and a potential on the bit line BITB_P0 gradually lowers from the H level because current is pulled out through the NMOS transistor NM1 and the inverter INV0 of the memory cell MN0. The bit line pair BIT_P0 and BITB_P0 are connected to one and the other inputs of the sense amplifier SA_P0 through the PMOS transistors PM4 and PM5, respectively. The sense amplifier SA_P0 detects a potential difference in the bit line pair BIT_P0 and BITB_P0 and outputs the result as an output signal DOUT_P0.

In the read cycle of the first port PORT_1 (the cycle shown at "R" in FIG. 17), the word line selection signal WORD_P1<1> and the bit line selection signal RSEL_P1 enter a selection state. The memory cell MC1 is selected and its data is outputted onto the bit line pair BIT_P1 and BITB_P1. Similarly to the read operation in the zeroth port PORT_0, a potential difference in the bit line pair is detected in the sense amplifier SA_P1 through the PMOS transistors PM6 and PM7 and the result is outputted as an output signal DOUT_P1.

In the write cycle (the cycle shown at "W" in FIG. 17), the word line selection signal WORD_P1<1> and the bit line selection signal WSEL_P1 go into a selection state. According to data defined by the input signal DIN_P1, one bit line of the bit line pair BIT_P1 and BITB_P1 is set to an H level and the other bit line is set to an L level. For example, when the data applied to the input signal DIN_P1 is at the L level, the bit line BIT_P1 is set to an L level (ground level) and the bit line BITB_P1 is set to an H level (power-supply VDD level). The node N10 of the memory cell MC1 is thus forced onto the L level and the node N11 is forced onto the H level.

As explained above, the dual port memory shown in FIG. 16 having word lines and bit line pairs independently provided for respective ports allows independent read/write operation of memory cells connected in the same column without interference between the ports. Generally, however, simultaneous read and write operation to the same memory cell is forbidden. Providing two word lines and four bit lines for each memory cell causes a considerable increase in area as compared with a single port memory cell having one word line and two bit lines. Moreover, while a single port memory cell is composed of two PMOS transistors and four NMOS transistors, the conventional dual port memory further requires two extra NMOS transistors as shown in FIG. 16, which also leads to an increase in area.

Since the dual port memory causes such a large increase in area as compared with a single port one, its use is often avoided by taking an alternative way even when its function is needed. Actually, there is an example of realizing an apparent dual port memory in which a single port memory portion only is operated at double the speed with respect to a system clock and accessed twice in one system cycle.

SUMMARY OF THE INVENTION

According to a first aspect of the present invention, a semiconductor storage device comprises: a first port for reading only; a second port for reading and writing; first and second bit lines provided corresponding to the first and second ports, respectively; a plurality of first and second word lines each provided corresponding to the first and second ports, respectively, the plurality of first and second word lines corresponding to each other in a one-to-one manner; a plurality of memory cells provided between the first and second bit lines, the plurality of memory cells each having first and second nodes providing signals in a logically inverted relation to each other, wherein the first node is connected to the first bit line when the first word line corresponding to the first bit line, in the plurality of first word lines, is in an active state and the second node is connected to the second bit line when the second word line corresponding to the second bit line, in the plurality of second word lines, is in an active state; a first sense amplifier connected to the first bit line for outputting a first amplify signal on the basis of a potential on the first bit line; a second sense amplifier connected to the second bit line for outputting a second amplify signal on the basis of a potential on the second bit line; and write signal output means receiving an input signal from outside, for outputting, on the basis of the input signal, a write signal from an output portion and outputting from an inversion output portion an inversion write signal which is an logical inversion of the write signal; wherein a write operation of the second port is accomplished by continuously performing first and second write cycles, wherein in the first write cycle, a first selection word line, which is one of the plurality of first word lines, is brought to an active state and the first amplify signal is provided as an output signal of the first port, and a second selection word line, which is one of the plurality of second word lines, is brought to an active state, the inversion output portion of the write signal output means and the second bit line are electrically connected, and the inversion write signal is applied to the second node of a write object memory cell connected to the second selection word line in an active state in the plurality of memory cells; and in the second write cycle, the second word line corresponding to the first selection word line, in the plurality of second word lines, is brought to an active state and the second amplify signal is obtained as an output signal of the first port, and the first word line corresponding to the second selection word line, in the plurality of first word lines, is brought to an active state, the output portion of the write signal output means and the first bit line are electrically connected, and the write signal is applied to the first node of the write object memory cell.

Preferably, according to a second aspect, in the semiconductor storage device, the first sense amplifier receives a reference potential, and detects and amplifies a potential difference between the potential on the first bit line and the reference potential to output the first amplify signal, the second sense amplifier receives the reference potential, and detects and amplifies a potential difference between the potential on the second bit line and the reference potential to output the second amplify signal; wherein a read operation of the second port is accomplished by carrying out a read cycle of bringing one of the plurality of first word lines to an active state and providing the first amplify signal as a read signal of the first port and bringing one of the plurality of second word lines to an active state and providing the second amplify signal as an output signal of the second port.

Preferably, according to a third aspect, the semiconductor storage device further comprises port exchange signal generating means for generating a port exchange signal which takes a first state at least in a part of the first write cycle and takes a second state at least in a part of the second write cycle, and word line switching means receiving a plurality of first and second word line selection signals activating the plurality of first and second word lines in a one-to-one correspondence and the port exchange signal, for providing the plurality of first and second word line selection signals respectively to the plurality of first and second word lines when the port exchange signal is in the first state, and providing the plurality of first and second word line selection signals respectively to the plurality of second and first word lines when the port exchange signal is in the second state.

Preferably, according to a fourth aspect, the semiconductor storage device further comprises in-reading bit line switching means receiving first and second in-reading bit line selection signals and the port exchange signal, for controlling conduction/cutoff between the first and second bit lines and input portions of the first and second sense amplifiers respectively under control by the first and second in-reading bit line selection signals when the port exchange signal is in the first state, and controlling conduction/cutoff between the second and first bit lines and the input portions of the second and first sense amplifiers respectively under control by the first and second in-reading bit line selection signals when the port exchange signal is in the second state.

Preferably, according to a fifth aspect, the semiconductor storage device further comprises in-writing bit line switching means receiving an in-writing bit line selection signal and the port exchange signal, for controlling conduction/cutoff between the second bit line and the inversion output portion of the write signal output means under control by the in-writing bit line selection signal when the port exchange signal is in the first state and controlling conduction/cutoff between the first bit line and the output portion of the write signal output means under control by the in-writing bit line selection signal when the port exchange signal is in the second state.

Preferably, according to a sixth aspect, the semiconductor storage device further comprises output signal switching means, receiving the first and second amplify signals and the port exchange signal, for outputting the first and second amplify signals respectively as output signals of the first and second ports when the port exchange signal is in the first state, and outputting the first and second amplify signals respectively as output signals of the second and first ports when the port exchange signal is in the second state.

Preferably, according to a seventh aspect, the semiconductor storage device further comprises precharge bit line switching means receiving the first and second precharge signals and the port exchange signal, for precharging the first and second bit lines to a predetermined potential under control by the first and second precharge signals when the port exchange signal is in the first state and precharging the second and first bit lines to the predetermined potential under control by the first and second precharge signals when the port exchange signal is in the second state.

Preferably, according to an eighth aspect, in the semiconductor storage device, the word line switching means, the in-reading bit line switching means, the in-writing bit line switching means, the output signal switching means and the precharge bit line switching means are each composed of the same circuit structure of 2-input and 2-output receiving the port exchange signal as a control input.

Preferably, according to a ninth aspect, in the semiconductor storage device, the first and second precharge signals are signals having respective independent periods, wherein the read cycle in the first port is performed in synchronization with the first precharge signal and the read cycle and the first and second write cycles in the second port are preformed in synchronization with the second precharge signal, the first and second precharge signals taking an inactive state in the first half of their respective periods and taking in the latter half an active state which indicates a precharge operation to the predetermined potential, wherein the port exchange signal generating means receives a write enable signal indicating whether a write operation or not and the first and second precharge signals, sets a port exchange enable period including a period from a part of the latter half of the first write cycle to a part of the first half of the second write cycle when the write enable signal indicates a write operation, and is triggered by an edge change detection to an inactive state of the first or second precharge signal in the port exchange enable period to change the port exchange signal from the first state to the second state.

Preferably, according to a tenth aspect, in the semiconductor storage device, the port exchange signal generating means sets the port exchange enable period starting at an edge change of the second precharge signal to an active state in the first write cycle and terminating at an edge change of the second precharge signal to an inactive state in the second write cycle.

Preferably, according to an eleventh aspect, in the semiconductor storage device, the port exchange signal generating means sets the port exchange enable period starting when a predetermined time has passed from an edge change of the second precharge signal to an active state in the first write cycle and terminating when the predetermined time has passed from an edge change of the second precharge signal to an inactive state in the second write cycle.

Preferably, according to a twelfth aspect, in the semiconductor storage device, the word line switching means, the in-reading bit line switching means, the output signal switching means and the precharge bit line switching means are each formed of the same 2-input and 2-output circuit structure receiving the port exchange signal as a control input, and the in-writing bit line switching means includes a first transistor interposed between the output portion of the write signal output means and the first bit line, a second transistor interposed between the inversion output portion of the write signal output means and the second bit line, a first logical circuit receiving the in-writing bit line selection signal and the port exchange signal, for outputting to a control electrode of the first transistor a first logic signal indicating conduction/cutoff on the basis of the in-writing bit line selection signal only when the port exchange signal indicates the second state, and a second logical circuit receiving the in-writing bit line selection signal and the port exchange signal, for outputting to a control electrode of the second transistor a second logic signal indicating conduction/cutoff on the basis of the in-writing bit line selection signal only when the port exchange enable signal indicates the first state.

Preferably, according to a thirteenth aspect, the semiconductor storage device further comprises precharge signal waveform transforming means receiving the first precharge signal for waveform transforming a period of an inactive state of the first precharge signal to one-half of a period of the second precharge signal or shorter.

Preferably, according to a fourteenth aspect, in the semiconductor storage device, the output signal switching means includes sense amplifier output cutting-off means receiving a write enable relating signal relating to the write enable signal for electrically cutting off an output portion of the second sense amplifier in writing.

Preferably, according to a fifteenth aspect, in the semiconductor storage device, the output signal switching means further comprises first and second latch circuits respectively receiving the first and second amplify signals under control by the write enable relating signal and the port exchange signal.

According to the semiconductor storage device of the first aspect of the present invention, a write operation in the second port is accomplished by continuously performing first and second write cycles.

In the first write cycle, an inversion write signal is provided to the second node of a write object memory cell connected to an active state second selection word line among the plurality of memory cells, and in the second write cycle, a write signal is provided to the first node of the write object memory cell. Therefore, data indicated by an input signal can be correctly written into the write object memory cell whatever potentials are set on the first and second bit lines before executing the first and second write cycles.

In the first write cycle, a first selection word line, which is one of the plurality of first word lines, is activated and the first amplify signal obtained from data stored in a memory cell which is an object of reading passing through the first bit line and the first sense amplifier is provided as an output signal of the first port. In the second write cycle, in the plurality of second word lines, a second word line corresponding to the above first selection word line is activated and the second amplify signal obtained as data stored in a read object memory cell passes through the second bit line and the second sense amplifier is provided as an output of the first port. Hence, reading operation of the first port can be performed without any problem even during write operation of the second port.

Accordingly, the semiconductor storage device of the first aspect allows read operation of the first port and write operation of the second port to be independently performed only with two bit lines, providing a degree of integration equivalent to that of a single port semiconductor storage device.

The first and second sense amplifiers in the semiconductor storage device of the second aspect detects and amplifies a potential difference between a reference potential and potentials on the first and second bit lines to output first and second amplify signals, respectively. Read operation of the second port can be accomplished by performing a read cycle with the first amplify signal as a read signal of the first port and the second amplify signal as an output signal of the second port.

Accordingly, the semiconductor storage device of the second aspect further allows read operation of the first port and read operation of the second port to be independently performed only with two bit lines.

In the semiconductor storage device according to the third aspect, with a plurality of first and second word lines set for the first and second ports, a first word line selection signal, which is one of a plurality of first word line selection signals, is activated, and a second word line selection signal, which is one of a plurality of second word line selection signals, is activated, and then the first and second write cycles are performed as follows.

In the period in which the port exchange signal is in the first state in the first write cycle, a word line, in the plurality of second word lines, to which the activated second word line selection signal is applied serves as a second selection word line and an inversion write signal is provided to the second node of a write object memory cell connected to this second selection word line.

In the period in which the port exchange signal is in the second state in the second write cycle, one of the plurality of first word lines provided with the second word line selection signal in an active state serves as a first word line corresponding to the second selection word line and thus the write signal is provided to the first node of the aforementioned write object memory cell.

Hence, data indicated by the input signal can be written into the write object memory cell under control by the port exchange signal.

The in-reading bit line switching means of the semiconductor storage device of the fourth aspect controls conduction/cutoff between the first and second bit lines and the input portions of the first and second sense amplifiers respectively under control by the first and second in-reading bit line selection signals when the port exchange signal is in the first state and controls conduction/cutoff between the second and first bit lines and the input portions of the second and first sense amplifiers respectively under control by the first and second in-reading bit line selection signals when the port exchange signal is in the second state.

Accordingly, when the first and second in-reading bit line selection signals are respectively set for the first port and the second port, it is possible to control conduction/cutoff between the second bit line and the input portion of the second sense amplifier with the first in-reading bit line selection signal in the period in which the port exchange signal is in the second state in the second write cycle to conduct output control of the second amplify signal and provide the second amplify signal as an output signal of the first port.

The in-writing bit line switching means of the semiconductor storage device of the fifth aspect controls conduction/cutoff between the second bit line and the output portion of the write signal output means under control by the in-writing bit line selection signal when the port exchange signal is in the first state and controls conduction/cutoff between the first bit line and the output portion of the write signal output means under control by the in-writing bit line selection signal when the port exchange signal is in the second state.

In the period in which the port exchange signal is in the first state in the first write cycle, an inversion write signal is provided to the second bit line under control by the in-writing bit line selection signal, and as a result, the inversion write signal is provided to the second node of the write object memory cell.

In the period in which the port exchange signal is in the second state in the second write cycle, the write signal is applied to the first bit line under control by the in-writing bit line selection signal, and as a result, the write signal is applied to the first node of the aforementioned write object memory cell.

The output signal switching means of the semiconductor storage device of the sixth aspect outputs the first and second amplify signals respectively as first and second port output signals when the port exchange signal is in the first state and outputs the first and second amplify signals respectively as second and first port output signals when the port exchange signal is in the second state.

Accordingly, the output signal switching means automatically causes the first amplify signal to be provided as a first port output signal in the period in which the port exchange signal is in the first state in the first write cycle and the second amplify signal to be provided as an output signal of the first port in the period in which the port exchange signal is in the second state in the second write cycle.

The precharge bit line switching means of the semiconductor storage device of the seventh aspect precharges the first and second bit lines to a certain potential under control by the first and second precharge signals when the port exchange signal is in the first state and precharges the second and first bit lines to the certain potential under control by the first and second precharge signals when the port exchange signal is in the second state.

Hence, with the first and second precharge signals set for the first and second ports, respectively, the first bit line can be precharged to the certain potential under control of the second precharge signal in the period in which the port exchange signal is in the second state in the second write cycle and the write signal can be provided to the first node of the write object memory cell using the first bit line.

According to the semiconductor storage device of the eighth aspect, the word line switching means, the in-reading bit line switching means, the in-writing bit line switching means, the output signal switching means and the precharge bit line switching means are each formed of the same 2-input and 2-output circuit structure receiving the port exchange signal as a control input, which can be realized with a relatively simple circuit structure.

The port exchange signal generating means of the ninth aspect sets a port exchange enable period including a period from part of the latter half of the first write cycle to part of the first half of the second write cycle when the write enable signal indicates write operation and changes the port exchange signal from the first state to the second state triggered by an edge change detection of the first or second precharge signal to an inactive state in the port exchange enable period.

It is therefore possible to cause the port exchange signal to necessarily take the first state at least in part of the first write cycle.

The port exchange signal generating means of the semiconductor storage device of the tenth aspect sets the port exchange enable period so that it terminates at an edge change of the second precharge signal to an inactive state in the second write cycle, which allows the length of the port exchange enable period to be set on the basis of the second precharge signal independently of the length of the write indicating period of the write enable signal.

As a result, even if a write enable signal with a hold time set enough to improve stability of write operation is used, the first bit line can be freed quickly after the second write cycle of the write operation is finished with the port exchange enable period suppressed to a necessary minimum.

The port exchange signal generating means of the semiconductor storage device of the eleventh aspect sets a port exchange enable period so that it starts when a certain time has passed after an edge change of the second precharge signal to an active state in the first write cycle and ends when the certain time has passed from an edge change of the second precharge signal to an inactive state in the second write cycle.

Accordingly, the first and second write cycles are performed without malfunction if the certain time is set to a time adequate as a period required to precharge the bit lines and then highly stable write operation can be done.

The in-writing bit line switching means of the semiconductor storage device of the twelfth aspect causes the first and second transistors to become conducting/cutoff with first and second logical signals outputted from the first and second logical circuits to select a bit line in writing. Since an output of a logic circuit has a driving force, it is not necessary to separately provide a driver for driving, which allows higher speed switching operation.

The precharge signal waveform transforming means of the semiconductor storage device of the thirteenth aspect waveform transforms the period of the inactive state of the first precharge signal to not more than one-half of the period of the second precharge signal. Hence, the read operation in the first port can surely be ended before the second write cycle is started, which prevents erroneous writing and re-reading and realizes normal operation.

The output signal switching means of the semiconductor storage device of the fourteenth aspect includes sense amplifier output cutting-off means for electrically cutting off the output portion of the second sense amplifier in writing, so that the circuit scale can be simplified.

The output signal switching means of the semiconductor storage device of the fifteenth aspect further includes first and second latch circuits respectively receiving the first and second amplify signals under control by the write enable relating signal and the port exchange signal. Hence, it is possible to continuously output an output signal outputted in the previous reading as an output signal of the first port or as an output signal of the second port even when it is not in the read operation period in the first and second ports.

The present invention has been made to solve the problems described before, and it is an object of the present invention to obtain a semiconductor storage device with 2-port structure with reduced circuit area.

These and other objects, features, aspects ad advantages of the present invention will become more apparent from the following detailed description of the present invention when taken in conjunction with the accompanying drawings.

BRIEF DESCRIPTION OF THE DRAWINGS

FIG. 5 is a circuit diagram showing the inside structure of a port exchange signal generating circuit of the first preferred embodiment.

FIG. 15 is a circuit diagram showing the structure of sense amplifiers and their vicinity in a dual port memory according to a sixth preferred embodiment of the present invention.

DESCRIPTION OF THE PREFERRED EMBODIMENTS

First Preferred Embodiment

Structure

Figure 1:
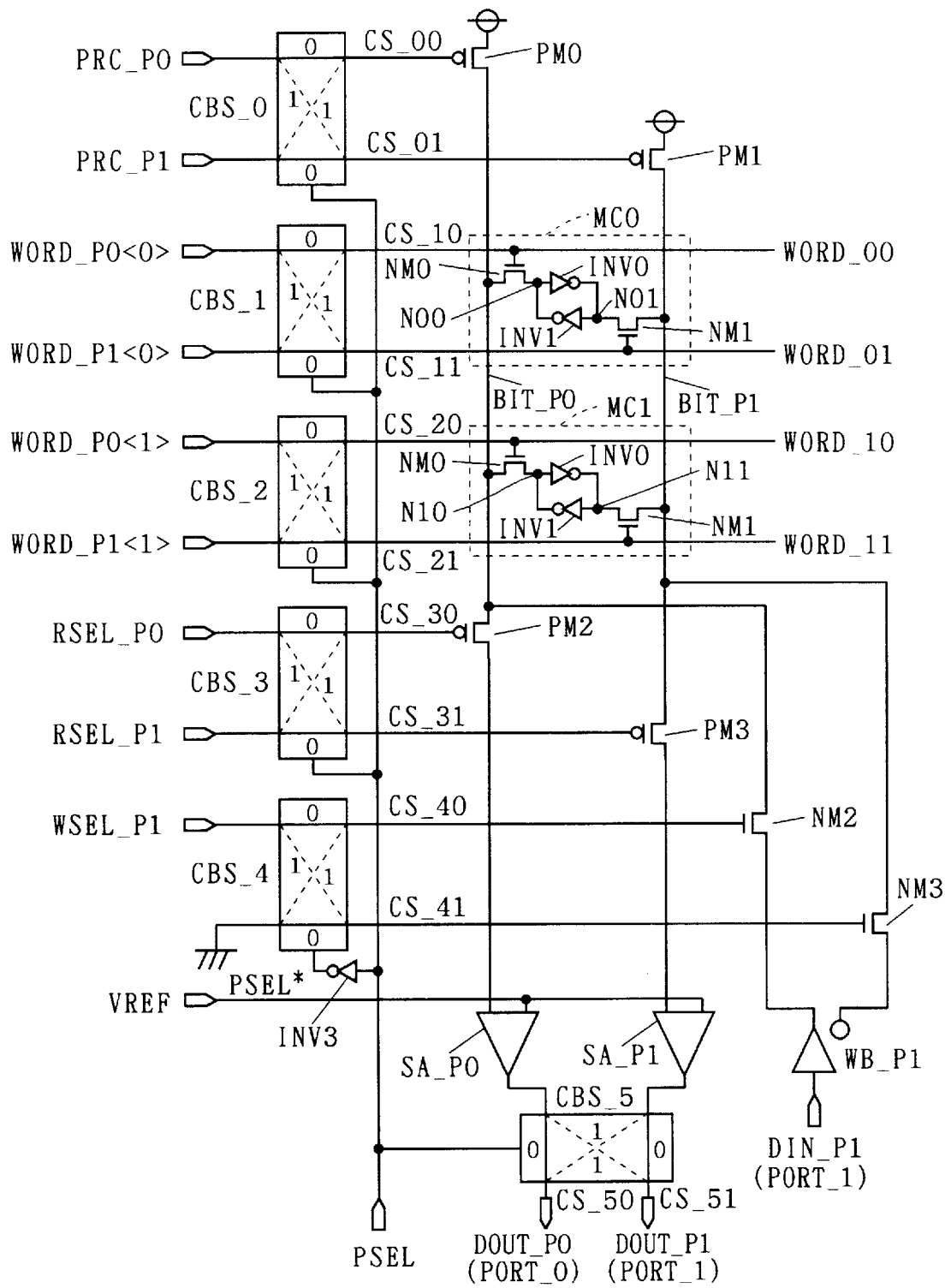
FIG. 1 is a circuit diagram showing the structure of a dual port memory according to a first preferred embodiment of the present invention.

FIG. 1 is a circuit diagram showing the structure of a dual port memory according to a first preferred embodiment of the present invention. In this figure, the zeroth (0th) port PORT__0 is a read-only port and the first port PORT__1 is a write/read port. WORD__00 to WORD__11 are word lines, WORD__P0<0> and WORD__P0<1> are word line selection signals for the zeroth port PORT__0, and WORD__P1<0> and WORD_P1<1> are word line selection signals for the first port PORT_1.

Precharge signals PRC_P0 and PRC_P1 are bit line precharge signals for the zeroth port PORT_0 and the first port PORT_1, respectively. The precharge signals PRC_P0 and PRC_P1 are signals on which the respective port operations are based, which are equivalent to clocks. RSEL_P0 is a bit line selection signal for use in reading in the zeroth port PORT_P0 and RSEL_P1 is a bit line selection signal for use in reading in the first port PORT_1. WSEL_P1 is a bit line selection signal for use in writing in the first port PORT_1.

Figure 16:
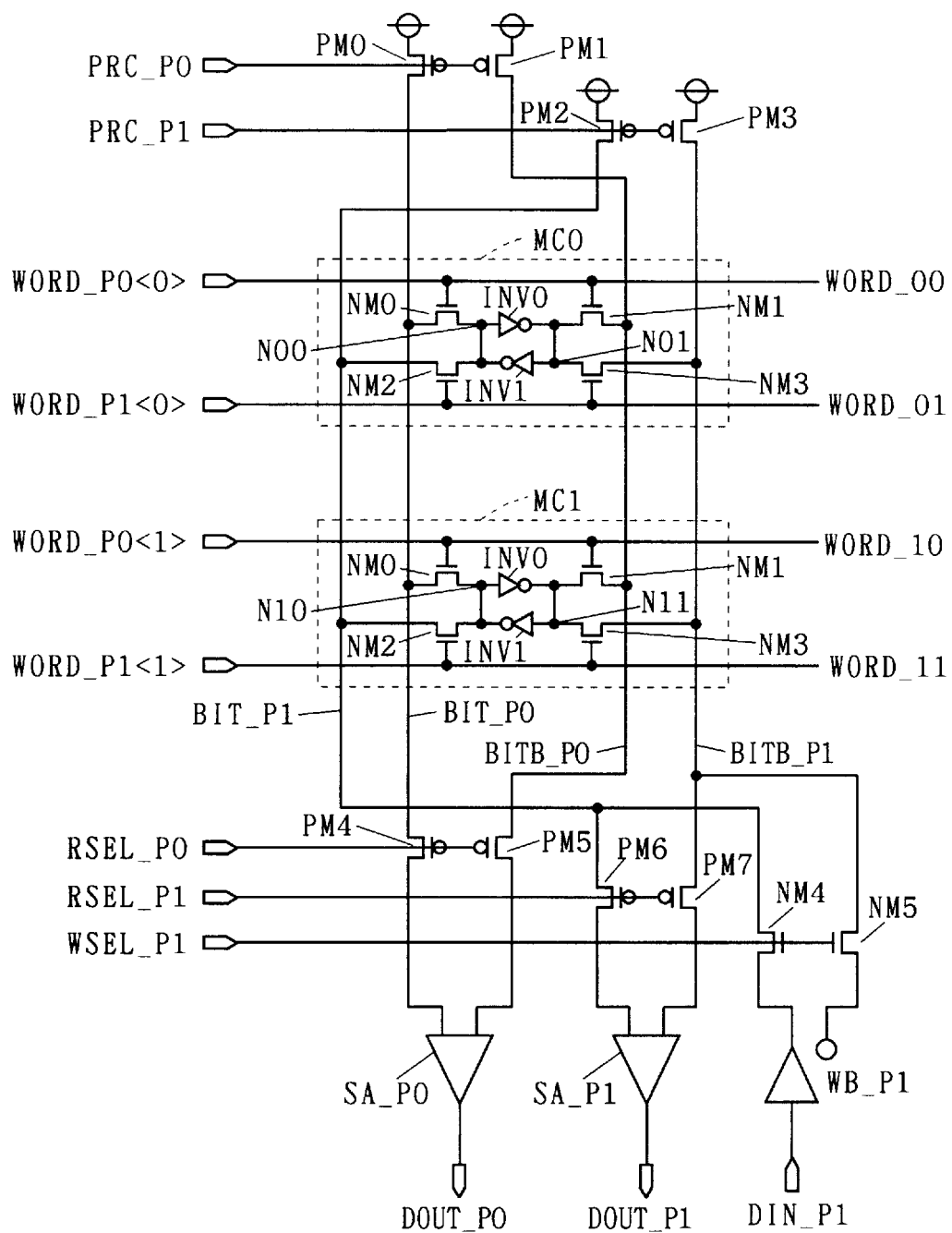
FIG. 16 is a circuit diagram showing the structure of a conventional dual port memory.
Figure 17:
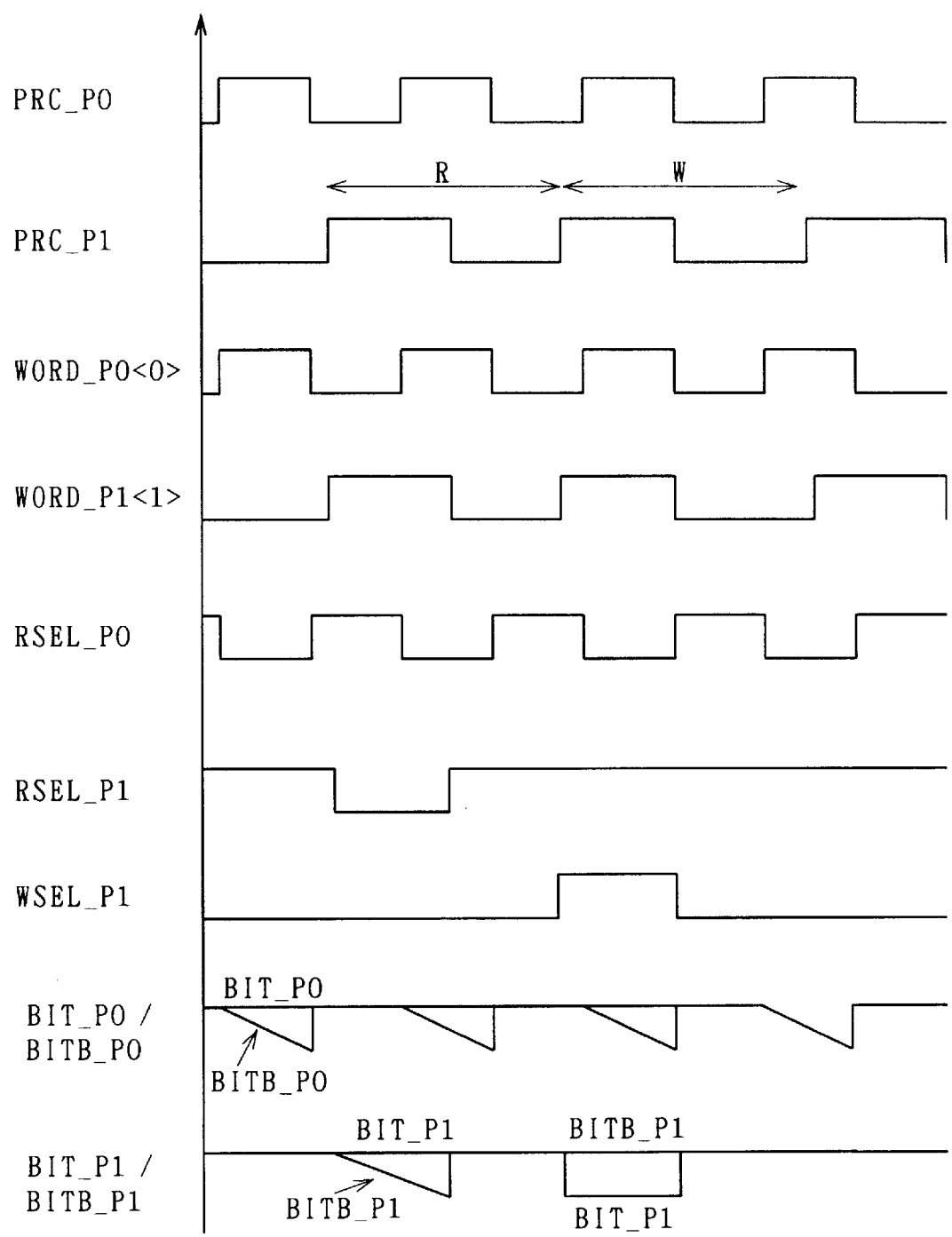
FIG. 17 is a timing chart showing operation of the dual port memory of FIG. 16.

In the dual port memory of the first preferred embodiment, unlike the conventional example shown in FIG. 16, only a single bit line is provided for each port according to the present invention. BIT_P0 is a bit line for the zeroth port PORT_0 and BIT_P1 is a bit line for the first port PORT_1. SA_P0 and SA_P1 are sense amplifiers for the zeroth port PORT_0 and the first port PORT_1, respectively. Read data of the zeroth port and the first port are outputted as output signals DOUT_P0 and DOUT_P1, respectively. WB_P1 is a write buffer for the first port PORT_1, which drives bit lines in writing according to an input signal DIN_P1.

MC0 and MC1 are memory cells, each memory cell being composed of two inverters INV0 and INV1 and two NMOS transistors (NM0, NM1). In the memory cell MCi (i=0, 1), the inverters INV0 and INV1 are loop connected, with the input portion of the inverter INV0 (the output portion of the inverter INV1) defined as a node Ni0 and the output portion of the inverter INV0 (the input portion of the inverter INV1) defined as a node Ni1, the node Ni0 being connected to the bit line BIT_P0 through the NMOS transistor NM0, the node Ni1 being connected to the bit line BIT_P1 through the NMOS transistor NM1. The NMOS transistor NM0 has its gate connected to the word line WORD_i0 and the NMOS transistor NM1 has its gate connected to the word line WORD_i1.

One end of the bit line BIT_P0 is connected to the power-supply VDD through a PMOS transistor PM0 and its other end is connected to one input of the sense amplifier SA_P0 through a PMOS transistor PM2 and also connected to the output portion of the write driver WB_P1 through an NMOS transistor NM2. One end of the bit line BIT_P1 is connected to the power-supply VDD through a PMOS transistor PM1 and its other end is connected to one input of the sense amplifier SA_P1 through a PMOS transistor PM3 and also connected to the inversion output portion of the write buffer WB_P1 through an NMOS transistor NM3. The sense amplifiers SA_P0 and SA_P1 receive a reference potential VREF at their respective other inputs. The sense amplifier SA_P0 detects and amplifies a potential difference between a potential on the bit line BIT_P0 and the reference potential VREF when the PMOS transistor PM2 is in an ON state to output a first amplify signal and the sense amplifier SA_P1 detects and amplifies a potential difference between a potential on the bit line BIT_P1 and the reference potential VREF when the PMOS transistor PM3 is in an ON state to output a second amplify signal.

A crossbar switch CBS_0 outputs one of the precharge signals PRC_P0 and PRC_P1 from the output portion CS_00 and the other signal from the output portion CS_01 according to a port exchange signal PSEL.

A crossbar switch CBS_1 outputs one of the word line selection signals WORD_P0<0> and WORD_P1<0> from the output portion CS_10 and the other signal from the output portion CS_11 on the basis of the port exchange signal PSEL.

A crossbar switch CBS_2 outputs one of the word line selection signals WORD_P0<1> and WORD_P1<1> from the output portion CS_20 and the other from the output portion CS_21 on the basis of the port exchange signal PSEL.

A crossbar switch CBS_3 outputs one of the reading bit line selection signals RSEL_P0 and RSEL_P1 from the output portion CS_30 and the other from the output portion CS_31 on the basis of the port exchange signal PSEL.

A crossbar switch CBS_4 outputs one signal of the writing bit line selection signal WSEL_P1 and a ground level from the output portion CS_40 and the other signal from the output portion CS_41 on the basis of an inversion port exchange signal PSEL* which is obtained as the port exchange signal PSEL passes through an inverter INV3.

A crossbar switch CBS_5 outputs one of outputs of the sense amplifiers SA_P0 and SA_P1 from the output portion CS_50 and the other output from the output portion CS_51 on the basis of the port exchange signal PSEL.

The PMOS transistor PM0 has its gate connected to the output portion CS_00 of the crossbar switch CBS_0 and the PMOS transistor PM1 has its gate connected to the output portion CS_01 of the crossbar switch CBS_0.

The word line WORD_00 is connected to the output portion CS_10 of the crossbar switch CSB_1 and the word line WORD_01 is connected to the output portion CS_11 of the crossbar switch CBS_1.

The word line WORD_10 is connected to the output portion CS_20 of the crossbar switch CBS_2 and the word line WORD_11 is connected to the output portion CS_21 of the crossbar switch CBS_2.

The PMOS transistor PM2 has its gate connected to the output portion CS_30 of the crossbar switch CBS_3 and the PMOS transistor PM3 has its gate connected to the output portion CS_31 of the crossbar switch CBS_3.

The NMOS transistor NM2 has its gate connected to the output portion CS_40 of the crossbar switch CBS_4 and the NMOS transistor NM3 has its gate connected to the output portion CS_41 of the crossbar switch CBS_4.

The output signal DOUT_P0 is outputted from the output portion CS_50 of the crossbar switch CBS_5 and the output signal DOUT_P1 is outputted from its output portion CS_51.

In the dual port memory, operation condition is the hardest when read or write is applied from each port to memory cells in the same column. If normal operation is ensured in this condition, no problem will occur in read or write from each port to memory cells in different columns.

The dual port memory of the first preferred embodiment shown in FIG. 1 shows only two memory cells connected to the same column to describe operation under the hardest condition, but actually, it has a large number of word lines and bit lines with a large number of memory cells connected to the word lines and bit lines.

Figure 2:
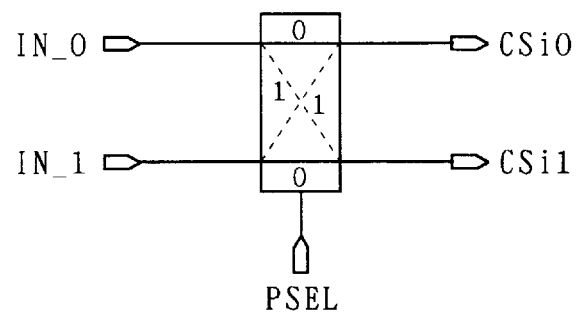
FIG. 2 is an explanation drawing showing the outline of a crossbar switch.

FIG. 2 is an explanation drawing showing the structure of the crossbar switch CBS_i (i=0 to 5). As shown in the figure, the crossbar switch CBS_i has input portions IN_0 and IN_1 and output portions CS_i0 and CS_i1. When the port exchange signal PSEL is at an L level (="0"), it outputs from the output portion CS_i0 a signal obtained from the input portion IN_0 and outputs from the output portion CS_i1 a signal obtained from the input portion IN_1, and when the port exchange signal PSEL is at an H level (="1"), it outputs from the output portion CS_i1 the signal obtained from the input portion IN_0 and outputs from the output portion CS_i0 the signal obtained from the input portion IN_1.

Figure 3:
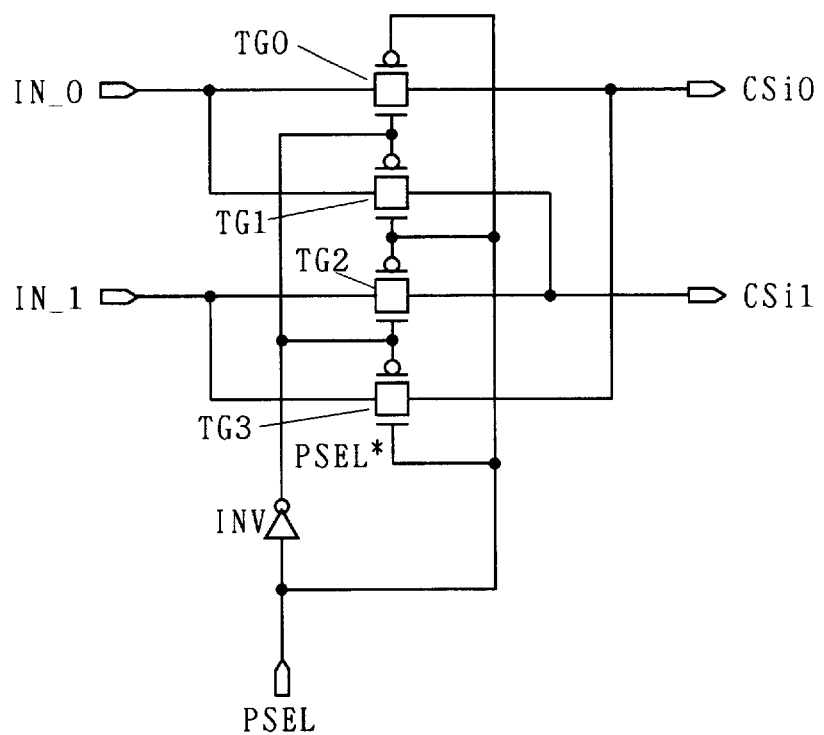
FIG. 3 is a circuit diagram showing the inside structure of the crossbar switch.

FIG. 3 is a circuit diagram showing the inside structure of the crossbar switch CBS_i. It is formed of four transmission gates TG0–TG3 and one inverter INV.

The transmission gate TG0 is interposed between the input portion IN_0 and the output portion CS_i0, the transmission gate TG1 is interposed between the input portion IN_0 and the output portion CS_i1, the transmission gate TG2 is interposed between the input portion IN_1 and the output portion CS_i1, and the transmission gate TG3 is interposed between the input portion IN_1 and the output portion CS_i0. The transmission gates TG0 and TG2 receive the port exchange signal PSEL at their respective PMOS gates and receive the inversion port exchange signal PSEL*, obtained from the port exchange signal PSEL passing through the inverter INV, at their respective NMOS gates. The transmission gates TG1 and TG3 receive the port exchange signal PSEL at their respective NMOS gates and receive the inversion port exchange signal PSEL*, obtained as the port exchange signal PSEL passes through the inverter INV, at their respective PMOS gates.

In such a structure, when the port exchange signal PSEL is at an L level, the transmission gates TG0 and TG2 turn on and the transmission gates TG1 and TG3 turn off, and then the input portion IN_0 is connected to the output portion CS_i0 and the input portion IN_1 is connected to the output portion CS_i1. When the port exchange signal PSEL is at an H level, the transmission gates TG1 and TG3 turn on and the transmission gates TG0 and TG2 turn off, and then the input portion IN_0 is connected to the output portion CS_i1 and the input portion IN_1 is connected to the output portion CS_i0.

Operation

Read Operation

Figure 4:
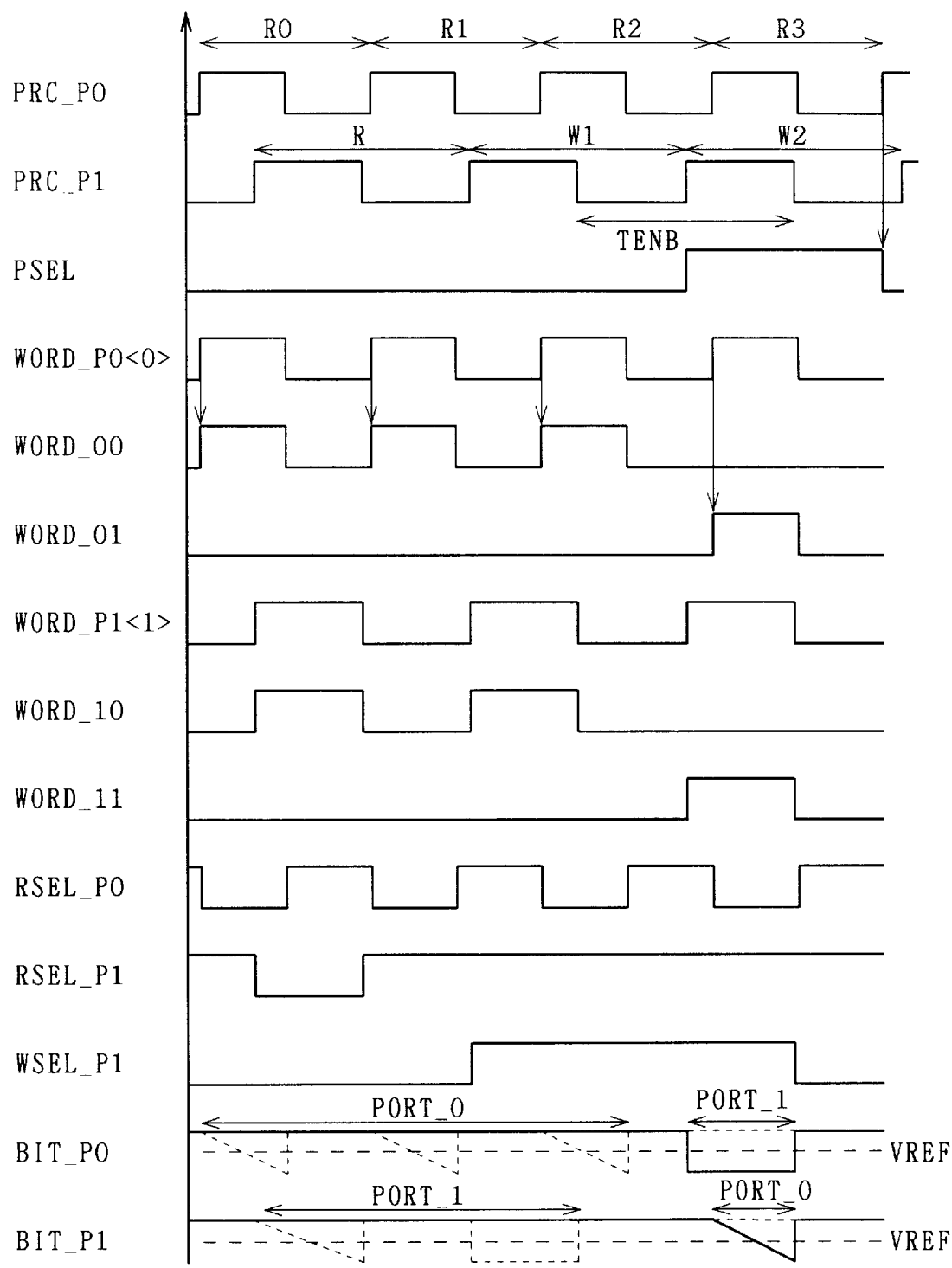
FIG. 4 is a timing chart showing operation of the first preferred embodiment.

FIG. 4 is a timing chart showing operation of the dual port memory of the first preferred embodiment. In the operation shown in FIG. 4, the zeroth port PORT_0 selects the memory cell MC0 and the first port PORT_1 selects the memory cell MC1. When the first port PORT_1 is reading (the cycle shown at "R" in FIG. 4), the port exchange signal PSEL is fixed at the L level.

At this time, read operation of the zeroth port PORT_0 is as follows. When the precharge signal PRC_P0 is at an L level, the bit line BIT_P0 is precharged to an H level. The word line selection signals and the bit line selection signals are set to enter a selection state when the precharge signal is at an H level, like the conventional one. The L level of the reading bit line selection signals RSEL_P0 and RSEL_P1 corresponds to a selection state and the H level of the writing bit line selection signal WSEL_P1 corresponds to a selection state.

Triggered by an H level change of the precharge signal PRC_P0, the word line selection signal WORD_P0<0> attains an H level and the reading bit line selection signal RSEL_P0 goes to an L level. At this time, the word line WORD_00 is selected and data in the memory cell MC0 is outputted onto the bit line BIT_P0. For example, if the data is held with the node N00 of the memory cell MC0 at an H level and the node N01 at an L level, the bit line BIT_P0 is then held unchanged at the H level. On the other hand, if the data is held with the node N00 of the memory cell MC0 at an L level and the N01 at an H level, the potential on the bit line BIT_P0 gradually falls from the H level because a current is pulled out through the NMOS transistor NM0 and the inverter INV1 of the memory cell MC0. This potential on the bit line BIT_P0 is supplied to one input of the sense amplifier SA_P0 through the PMOS transistor PM2. The sense amplifier SA_P0 compares the reference potential VREF and the potential on the bit line BIT_P0 and outputs the first amplify signal as the output signal DOUT_P0.

In FIG. 4, the broken line shows the decreasing potential on the bit line BIT_P0. The reference potential VREF is set between the power-supply potential and the ground potential. As each port can use only a single bit line, unlike the conventional example, reading is enabled not by comparison in potential in a bit line pair but by comparison between a potential on a bit line and the reference potential.

Read operation of the first port PORT_1 is the same as that of the zeroth port PORT_0. When the precharge signal PRC_P1 is at the L level, the bit line BIT_P1 is precharged to the H level. When the precharge signal PRC_P1 attains the H level, the word line selection signal WORD_P1<1> goes to the H level and the bit line selection signal RSEL_P1 goes to the 1 level. The word line WORD_11 is selected and data in the memory cell MC1 is outputted to the bit line BIT_P1. The bit line potential is applied to one input of the sense amplifier SA_P1 through the PMOS transistor PM3. The sense amplifier SA_P1 compares the reference potential VREF and the potential on the bit line BIT_P1 to output the second amplify signal as the output signal DOUT_P1.

This way, dividing a pair of bit lines between ports enables read operation without interference.

Write Operation

Principle

Next, write operation will be described. Since a single bit line only is provided for a port, write operation is more complicated as compared with the read operation. It utilizes the fact that writing into a memory cell can be accomplished by bringing only one in a bit line pair connected thereto to an L level. That is to say, it utilizes that writing can be made by bringing to an L level a bit line connected to a node which requires L-level setting, among storage nodes of a memory cell.

A problem, however, occurs then. It may be necessary to bring the bit line BIT_P0 prepared for the read-only port onto an L level depending on write data. If the first port PORT_1 is permitted to use the BIT_P0, then the zeroth port PORT_0 can not perform read operation.

This problem can be solved as follows. That is to say, if the necessity of bringing the bit line BIT_P0 of the read-only port (zeroth port PORT_0) to an L level arises, the bit lines are exchanged between ports. The first port PORT_1 performs writing using the BIT_P0 and the zeroth port PORT_0 performs reading using the BIT_P1. Changing bit lines leading data from memory cells requires exchange of word lines. The exchange of word lines is accomplished by the crossbar switches CBS_1 and CBS_2. Since read data is on the BIT_P1, it is detected by the sense amplifier SA_P1. Accordingly, the bit line selection signal RSEL_P0 of the zeroth port PORT_0 must open the PM3. The exchange of the bit line selection signals is accomplished by the crossbar switch CBS_3. Since the second amplify signal detected and amplified in the sense amplifier SA_P1 is data of the zeroth port PORT_0, it must be outputted as the output signal DOUT_P0 of the zeroth port PORT_0. The exchange of outputs of the sense amplifiers is accomplished by the crossbar switch CBS_5. Since the zeroth port PORT_0 and the first port PORT_1 operate asynchronously, precharge operations matching respective operations are required. The crossbar switch CBS_0 is a crossbar switch for exchanging precharge operations between ports.

The aforementioned exchanges of the word lines, bit lines, sense amplifiers, and precharge signals between ports can be achieved by bringing the port exchange signal PSEL to an H level.

Actual Write Operation

Referring to FIG. 4, an actual write procedure will be described. Unlike reading, writing is made in two cycles (the cycles shown as "W1" and "W2" in FIG. 4.) Hence, it is necessary that addresses specifying the word line selection signals and bit line selection signals for the first port PORT_1 are fixed in the two cycles W1, W2 of the write period. In the first cycle W1 for writing, the zeroth port PORT_0 performs reading using the bit line BIT_P0 because the word line WORD_00 is selected and the first port PORT_1 performs writing using the bit line BIT_P1 because the word line WORD_11 is selected. Ports are not exchanged in this cycle.

If the write data (DIN_P1) is at the H level, then the crossbar switch CBS_4 applies the writing bit line selection signal WSEL_P1 to the gate of the NMOS transistor NM3 so that the NMOS transistor NM3 turns on and the bit line BIT_P1 goes to the L level. Hence, the node N11 of the memory cell MC1 goes to the L level and writing is completed at this point.

On the other hand, if the write data (DIN_P1) is at the L level, the bit line BIT_P1 holds the H level and write to the memory cell MC1 is not performed. The first write cycle W1 in which ports are not exchanged is provided at the beginning of the write operation because of the following reason. Since the ports operate asynchronously, the zeroth port PORT_0 may be in the course of reading at the time when writing is started (at the start of the cycle "W1"), and exchanging ports at this time will interrupt the reading operation of the zeroth port PORT_0. Ports are exchanged in the second write cycle W2. Timing for switching the crossbar switches will be described below. While the first port PORT_1 performs writing using the BIT_P1 in the first cycle W1, the first port PORT_1 becomes inactive in the latter half of the first cycle W1, i.e., when the precharge signal PRC_P1 goes to an L level. The word line WORD_11 enters an unselection state and the bit line BIT_P1 is freed and it enters a precharge mode. Waiting until the BIT_P1 is freed, a port exchange enable period TENB is set. The effective period of TENB is from the latter half of the first write cycle W1 (the period in which the precharge signal PRC_P1 is at the L level) to the first half of the second write cycle (the period in which the precharge signal PRC_P1 is at the H level). (It is the period shown as "TENB" in FIG. 4.)

The port exchange enable period TENB is a period in which the bit line BIT_P1 can be used for reading and the bit line BIT_P0 can be used for writing. In this period TENB, triggered by a rising edge of the precharge signal PRC_P0 or PRC_P1 (the rise of the precharge signal PRC_P1 in FIG. 4), the port exchange signal PSEL is placed on the H level. In FIG. 4, the read cycle R2 of the zeroth port PORT_0 does not have a rising edge of the precharge signal PRC_P0 in the period TENB, so that reading is performed using the bit line BIT_P0. Before the write operation of the second write cycle W2 uses the bit line BIT_P0 (the precharge signal PRC_P1 attains an H level), the reading operation of the reading cycle R2 frees the BIT_P0 (it frees it when the PRC_P0 goes to an L level), and therefore no contention occurs for the bit line BIT_P0 between the two ports.

In the next read cycle R3, since there is a rising edge of the precharge signal PRC_P0 in the period TENB, read operation is performed using the bit line BIT_P1. In the read cycle R3, the word line selection signal WORD_PF<0> is provided to the WORD_01 by the crossbar switch CBS_1. The reading bit line selection signal RSEL_P0 is provided to the gate of the PMOS transistor PM3 by the crossbar switch CBS_4.

In the second write cycle W2, in the first port PORT_1, the crossbar switches CBS_2 and CBS_4 supply the word line selection signal WORD_PF<1> to the WORD_10 and supply the writing bit line WSEL_P1 to the gate of the NMOS transistor NM2, and then the NMOS transistor NM2 turns on.

At this time, if the write data DIN_P1 is at the L level, writing could not be finished in the first write cycle W1. However, the bit line BIT_P0 can be used in the second write cycle W2, and the writing can be completed at this time.

In the second write cycle W2, the port exchange enable period TENB is canceled at a falling edge of the precharge signal PRC_P1. The port exchange signal PSEL is set to an L level in the read cycle of the zeroth port PORT_0 and in the read or write cycle of the first port PORT_1 starting after the period TENB is canceled. The zeroth port PORT_0 performs reading using the bit line BIT_P0 and the first port PORT_1 performs reading or the first cycle of writing using the bit line BIT_P1. At this time, since the bit line BIT_P0 has been freed from the write operation of the first port PORT_1, the read or write operation of the first port PORT_1 does not compete with the read operation of the zeroth port PORT_0.

Figure 5:
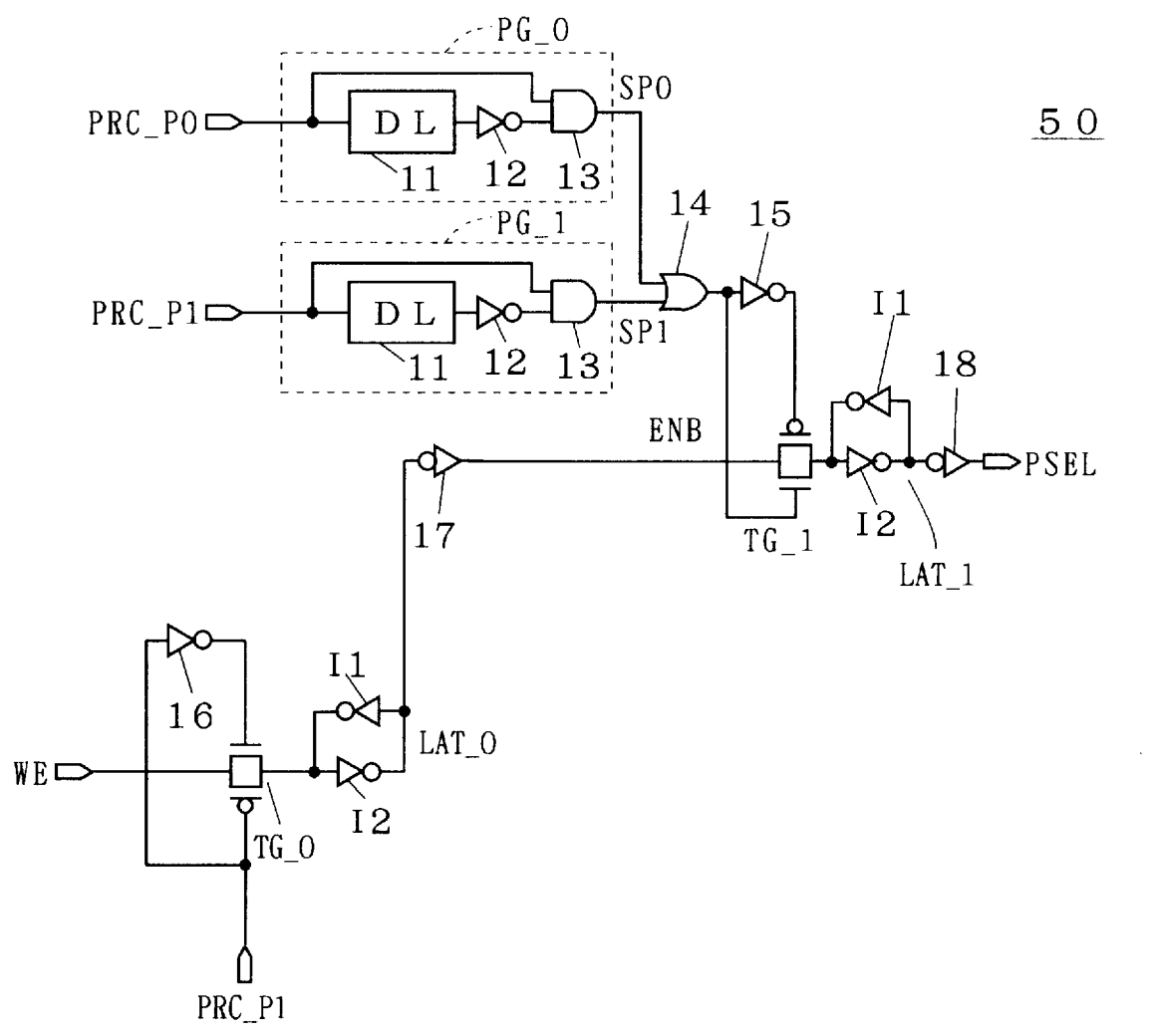

FIG. 5 shows a port exchange signal generating circuit 50 for generating a port exchange enable signal ENB defining the port exchange enable period TENB and the port exchange enable signal PSEL. In the figure, WE is a write enable signal, which indicates write at an H level. The TG_0 and TG_1 are transmission gates, LAT_0 and LAT_1 are latch circuits each formed of a loop connection of inverters I1 and I2.

Pulse generating circuits PG_0 and PG_1 receive the precharge signals PRC_P0 and PRC_P1 and output pulse signals SP0 and SP1, respectively. The pulse generating circuit PG_i (i=0, 1) includes a delay circuit 11, an inverter 12 and an AND gate 13, the AND gate 13 receiving the precharge signal PRC_Pi at its one input. The delay circuit 11 receives the precharge signal PRC_Pi, delays it for a delay time ΔT and outputs it to the other input of the AND gate 13 through the inverter 12. Then the output signal of the AND gate 13 becomes the pulse signal SPi. An OR gate 14 receives the pulse signals SP0 and SP1. The delay circuit 11 is generally composed of an even number of inverters.

The write enable signal WE is provided to the latch circuit LAT_0 through the transmission gate TG_0. The precharge signal PRC_P1 is provided to the PMOS gate of the transmission gate TG_0 and the precharge signal PRC_P1 is also provided to its NMOS gate through an inverter 16.

The output of the latch circuit LAT_0 is provided to the latch circuit LAT_1 through an inverter 17 and the transmission gate TG_1. The output of the OR gate 14 is applied to the NMOS gate of the transmission gate TG_1 and the output of the OR gate 14 is applied to the PMOS gate through an inverter 15. Then the output of the latch circuit LAT_1 is outputted as the port exchange signal PSEL through an inverter 18.

Figure 6:
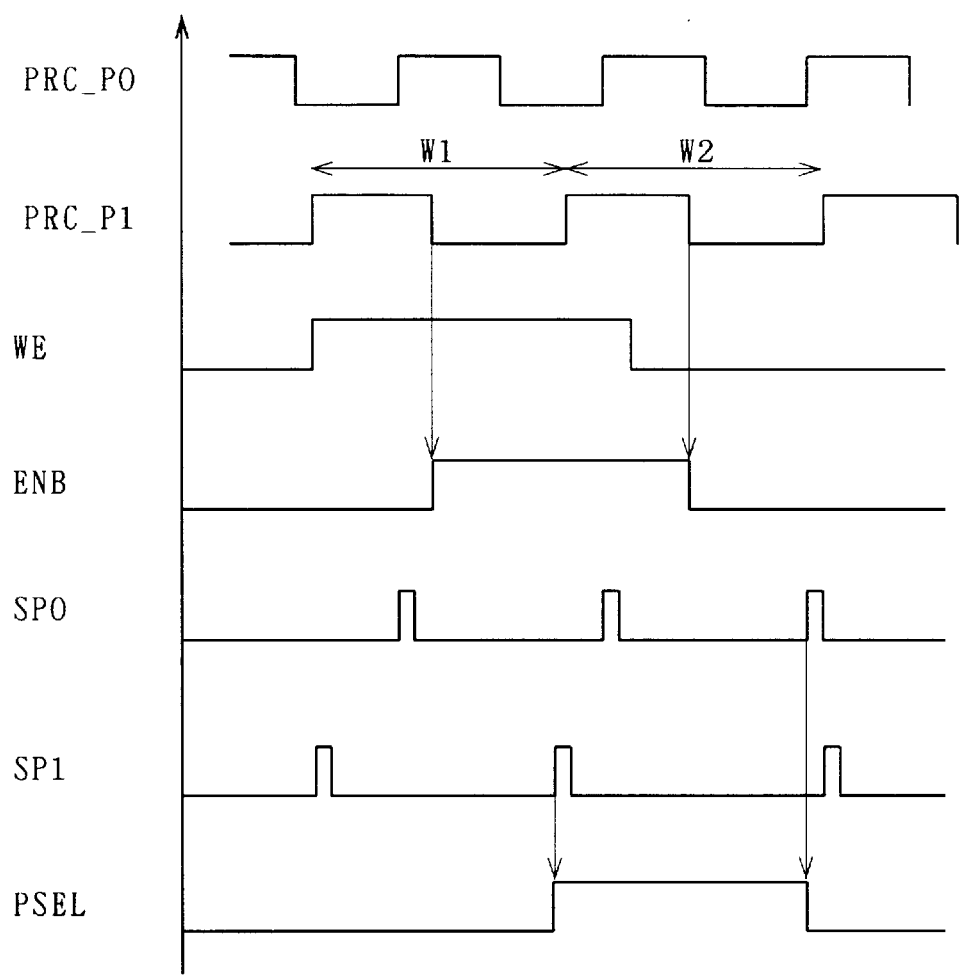
FIG. 6 is a timing chart showing operation of the port exchange signal generating circuit of FIG. 5.

FIG. 6 is a timing chart showing the operation of the generating circuit for the port exchange signal PSEL shown in FIG. 5. The write enable signal WE is provided from the outside such that it is at an H level at least in the first write cycle W1 in synchronization with the precharge signal PRC_P1. Because the transmission gate TG_0 turns on when the precharge signal PRC_P1 goes to the L level, the write enable signal WE is latched into the latch circuit LAT_0 half cycle later after the rising edge of the precharge signal PRC_P1.

Hence, the port exchange enable signal ENB rises half cycle after the rising edge of the precharge signal PRC_P1. Furthermore, as the write enable signal WE is latched at the time when the precharge PRC_P1 reaches the L level, the port exchange enable signal ENB falls also half cycle later a fall of the write enable signal WE. As a result, the port exchange enable signal ENB can be obtained which is at an H level only in the port exchange enable period TENB in FIG. 4.

As shown in FIG. 6, the pulse generating circuit PG_0 outputs the pulse signal SP0 which is at an H level in a certain period from a rise of the precharge signal PRC_P0 and the pulse generating circuit PG_1 outputs the pulse signal SP1 which is at an H level in a certain period from a rise of the recharge signal PRC_P1. The pulse signals SP0 and SP1 are inputted to the OR gate 14 and the output of the OR gate 14 controls the transmission gate TG_1. Accordingly, the port exchange signal PSEL attains an H level at the timing by one of the precharge signals PRC_P0 and PRC_P1 which first makes a rise in the period in which the port exchange signal ENB changes to the H level, and the port exchange signal PSEL returns to an L level at the timing by one of the precharge signals PRC_P0 and PRC_P1 which makes a rise change first in the period in which the port exchange signal ENB changes from the H level to the L level. As a result, the port exchange enable signal ENB can be obtained which satisfies the operation shown in FIG. 4.

This way, the dual port memory of the first preferred embodiment can realize a function of a dual port with a structure having a smaller number of elements and bit lines as compared with the conventional example by exchanging bit lines used in two ports as needed under control by the port exchange signal PSEL. As the number of elements and the number of bit lines are the same as those of a single port one, it can be formed in an area almost the same as a single port one.

Furthermore, the crossbar switches CBS_0–CBS_5 of the dual port memory of the first preferred embodiment, which are formed of the same circuit structure of 2-input and 2-output with the port exchange signal PSEL as a control input using the transfer gates TG0–TG3, can be realized with a relatively simple structure.

Second Preferred Embodiment

The write enable signal WE shown in the first preferred embodiment is used to select the writing bit select signal WSEL_P1. That is to say, the writing bit line selection signal WSEL_P1 in the H level period of the write enable signal WE is activated. Accordingly, it is necessary for the write enable signal WE to hold the H level at least from the beginning of the first write cycle W1 over the first half of the second write cycle W2 (the period in which the precharge signal PRC_P1 is at the H level.)

Figure 7:
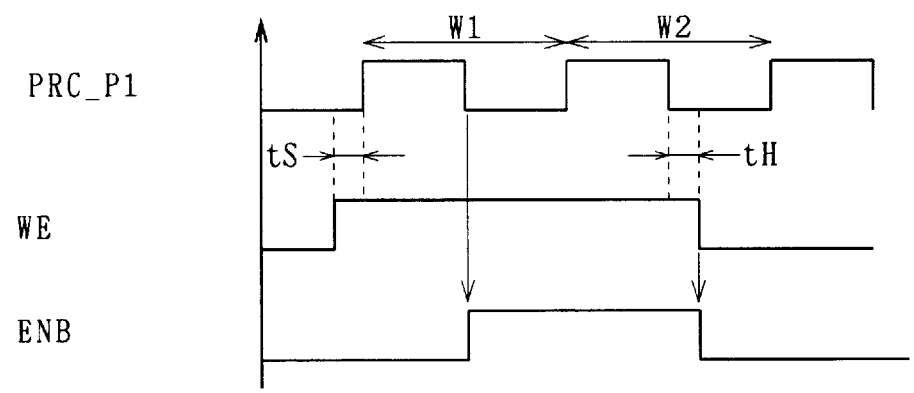
FIG. 7 is a timing chart for use in describing a setup time and a hold time of a write enable signal.

As shown in the timing chart of FIG. 7, in order to obtain stable operation, a setup time tS and a hold time tH are generally set in the write enable signal WE with respect to the precharge signal PRC_P1. In this case, however, in the port exchange signal PSEL generating circuit shown in FIG. 5, a rise of the port exchange enable signal ENB is defined by a fall of the precharge signal PRC_P1 in the first write cycle W1 and its fall is defined by the hold time tH. While a larger hold time tH is desirable in order to improve stability of the write operation by the writing bit line selection signal WSEL_P1, a smaller hold time tH is preferred in port exchange operation by the port exchange enable signal ENB because the bit line BIT_P0 must be quickly freed after writing is finished. The port exchange signal generating circuit of a second preferred embodiment is intended to satisfy this conflicting requirement for the write enable signal WE.

Figure 8:
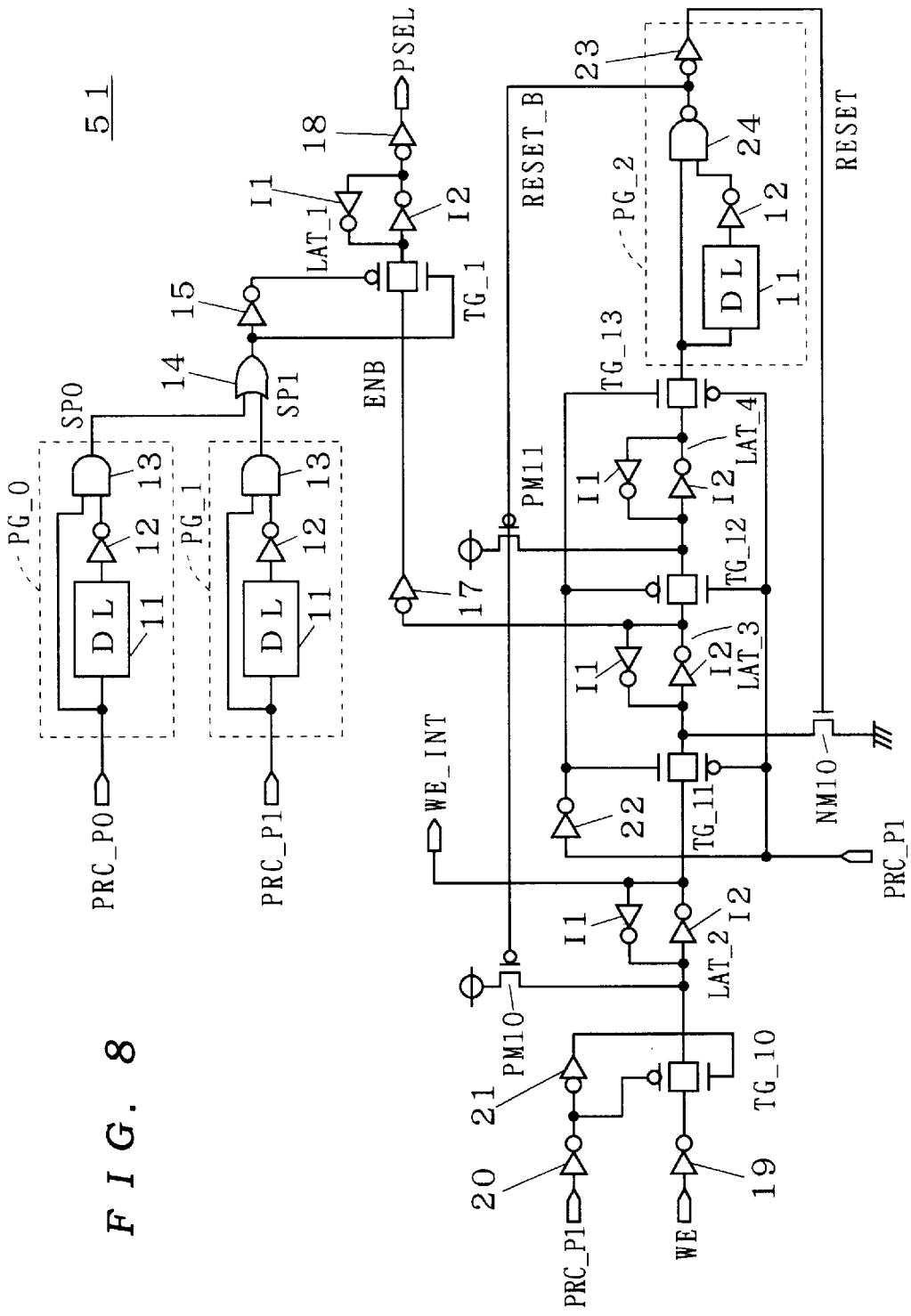
FIG. 8 is a circuit diagram showing the inside structure of a port exchange signal generating circuit of a second preferred embodiment.

FIG. 8 is a circuit diagram showing the structure of a port exchange signal generating circuit 51 of the second preferred embodiment. As shown in this figure, WE is a write enable signal which allows writing at an H level. TG_10–TG_13 are transmission gates, and LAT_1–LAT_4 are latch circuits each composed of a loop connection of inverters I1 and I2.

Pulse generating circuits PG_0 and PG_1, like the circuits shown in FIG. 5, receive the precharge signals PRC_P0 and PRC_P1 and output the pulse signals SP0 and SP1, respectively. A pulse generating circuit PG_2 is interposed between the transmission gate TG_13 and an inverter 23. Its inside structure is the same as that of the pulse generating circuits PG_1 and PG_2.

The write enable signal WE is applied to the latch circuit LAT_2 through an inverter 19 and the transmission gate TG_10. The PMOS gate of the transmission gate TG_10 is supplied with the precharge signal PRC_P1 through an inverter 20 and the NMOS gate is supplied with the precharge signal PRC_P1 through the inverters 20 and 21. A PMOS transistor PM10 is interposed between the input portion of the latch circuit LAT_2 and the power supply VDD.

The output of the latch circuit LAT_2 is applied to the latch circuit LAT_3 through the transmission gate TG_11. The PMOS gate of the transmission gate TG0_11 is supplied with the precharge signal PRC_P1 and the NMOS gate is supplied with the precharge signal PRC_P1 through an inverter 22. An NMOS transistor NM10 is interposed between the input portion of the latch circuit LAT_3 and the ground level.

The output of the latch circuit LAT_3 is applied to the latch circuit LAT_1 through an inverter 17 and the transmission gate TG_1. The NMOS gate of the transmission gate TG0_1 is supplied with the output of the OR gate 14 and the PMOS gate is supplied with the output of the OR gate 14 through the inverter 15. Then the output of the latch circuit LAT_1 is outputted as the port exchange signal PSEL through the inverter 18. Here, the output of the inverter 17 is defined as the port exchange enable signal ENB.

The output of the latch circuit LAT_3 is also applied to the latch circuit LAT_4 through the transmission gate TG_12. The NMOS gate of the transmission gate TG_12 is supplied with the precharge signal PRC_P1 and the PMOS gate is supplied with the precharge signal PRC_P1 through the inverter 22. A PMOS transistor PM11 is interposed between the input portion of the latch circuit LAT_4 and the power supply VDD.

The output of the latch circuit LAT_4 is applied to the pulse generating circuit PG_2 through the transmission gate TG_13. The PMOS gate of the transmission gate TG_13 is supplied with the precharge signal PRC_P1 and the NMOS gate is supplied with the precharge signal PRC_P1 through the inverter 22.

The pulse generating circuit PG_2 receives the output of the latch circuit LAT_4 through the transmission gate TG_13 and outputs a reset signal RESET and an inversion reset signal RESET_B. The pulse generating circuit PG_2 is composed of a delay circuit 11, an inverter 12, an NAND gate 24 and the inverter 23, where the NAND gate 24 receives the output of the latch circuit LAT_4 at its one input. The delay circuit 11 receives the output of the latch circuit LAT_4 and delays it for a delay time ΔT and outputs it to the other input of the NAND gate 24 through the inverter 12. The output signal of the NAND gate 24 becomes the inversion reset signal RESET_B. The inversion reset signal RESET_B passes through the inverter 23 to become the reset signal RESET.

The inversion reset signal RESET_B is applied to the gates of the PMOS transistors PM10 and PM11 and the reset signal RESET is applied to the gate of the NMOS transistor NM10.

Figure 9:
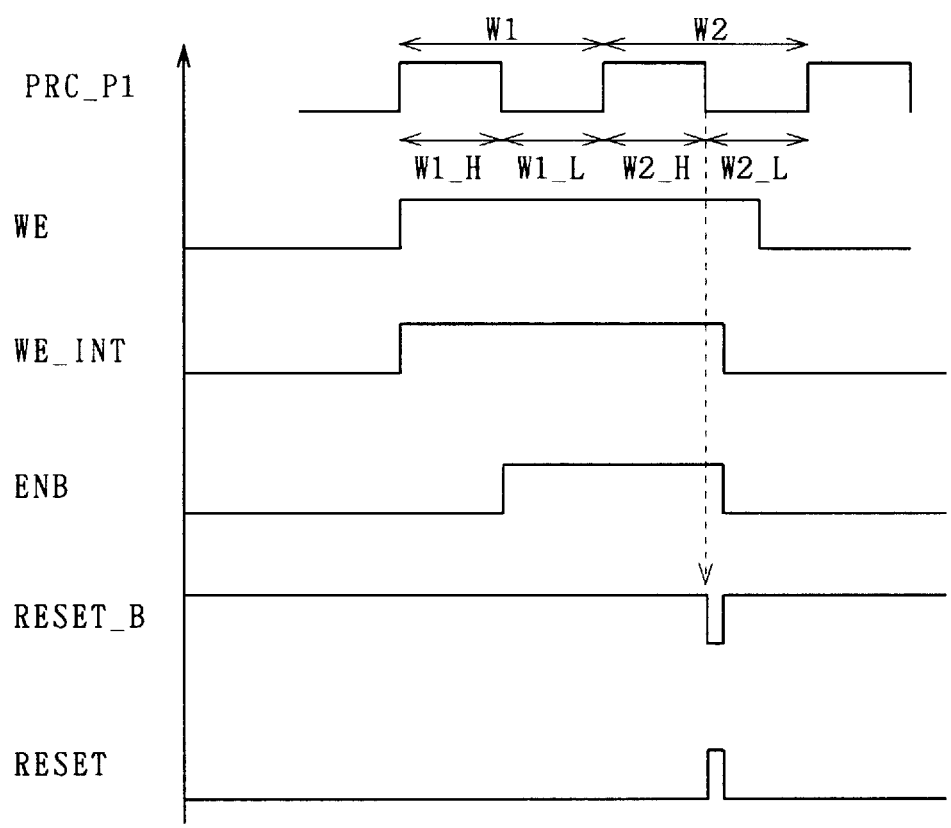
FIG. 9 is a timing chart showing operation of the port exchange signal generating circuit of FIG. 8.

FIG. 9 is a timing chart showing the operation of the port exchange signal generating circuit 51 shown in FIG. 8. As shown in this figure, in the first and second write cycles W1 and W2, their respective first half periods (the periods in which the precharge signal PRC_P1 is at the H level) are taken as W1_H and W2_H and their respective latter half periods (the periods in which the PRC_P1 is at the L level) are taken as W1_L and W2_L, respectively.

The write enable signal WE is set so that it is at the H level at least from the first write cycle W1 to the period W2_H of the second write cycle. When the precharge signal PRC_P1 is at the H level, the transmission gate TG_10 turns on to latch the write enable signal WE into the latch circuit LAT_2. An internal write enable signal WE_INT which is an output of the LAT_2 is used to actually activate the writing bit line selection signal WSEL_P1.

Therefore, the internal write enable signal WE_INT attains an H level at the beginning of the write cycle. The transmission gate TG_11 turns on in the next period W1_L and the latch circuit LAT_3 latches the output of the latch circuit LAT_2. The output of the latch circuit LAT_3 is used as the port exchange enable signal ENB. Hence, the port exchange enable signal ENB rises at the beginning of the period W1_L.

Then, the transmission gate TG_12 turns on in the period W2_H to transfer data in the latch circuit LAT_3 to the latch circuit LAT_4. Further, the transmission gate TG_13 turns on in the period W2_L, and then data in the latch circuit LAT_4 is fed into the pulse generating circuit PG_2 and the pulse generating circuit PG_2 outputs the reset signal RESET and the inversion reset signal RESET_B. As the inversion reset signal RESET_B outputs an L level pulse, the PMOS transistor PM10 turns on to initialize the input of the latch circuit LAT_2 to an H level. As a result, the internal write enable signal WE_INT is reset to an L level. At the same time, the PMOS transistor PM11 turns on and initializes the input of the latch circuit LAT_4 to an H level, which prevents the pulse generating circuit PG_2 from generating the reset pulses (the reset signal RESET= "H", the inversion reset signal RESET_B="L") in the next cycle.

As the reset signal RESET outputs an H level pulse, the NMOS transistor NM10 turns on to set the input of the latch circuit LAT_3 to an L level. This resets the port exchange enable signal ENB to an L level.

As explained above, even if the hold time tH is set in the write enable signal WE in synchronization with the precharge signal PRC_P1, it is possible to configure it so that the port exchange enable signal ENB falls with a fall of the precharge signal PRC_P1.

As a result, it is possible to quickly free the bit line BIT_P0 after write operation is finished when port exchange operation is made with the port exchange enable signal ENB, with a hold time tH set enough to improve stability of write operation by the writing bit line selection signal WSEL_P1 and the port exchange enable period TENB having a necessary shortest length.

Third Preferred Embodiment

In the first and second preferred embodiments, the port exchange enable signal ENB is brought to "H" immediately after the active period of the first write cycle W1 (the period in which PRC_P1 is at the H level) is finished to set the port exchange enable period TENB.

The zeroth port PORT_0 may start reading using the bit line BIT_P1 immediately after the first port PORT_1 performed writing of bringing the bit line BIT_P1 to the L level (when the DIN_P1 is at the H level.) In this case, the read operation may not be accomplished sufficiently because the bit line BIT_P1 is then not sufficiently precharged, and further, erroneous write may be applied to a read memory cell.

It is an object of the third preferred embodiment to obtain a port exchange enable signal ENB which ensures a time for precharging the bit line BIT_P1 by delaying a rise of the port exchange enable signal ENB.

Figure 10:
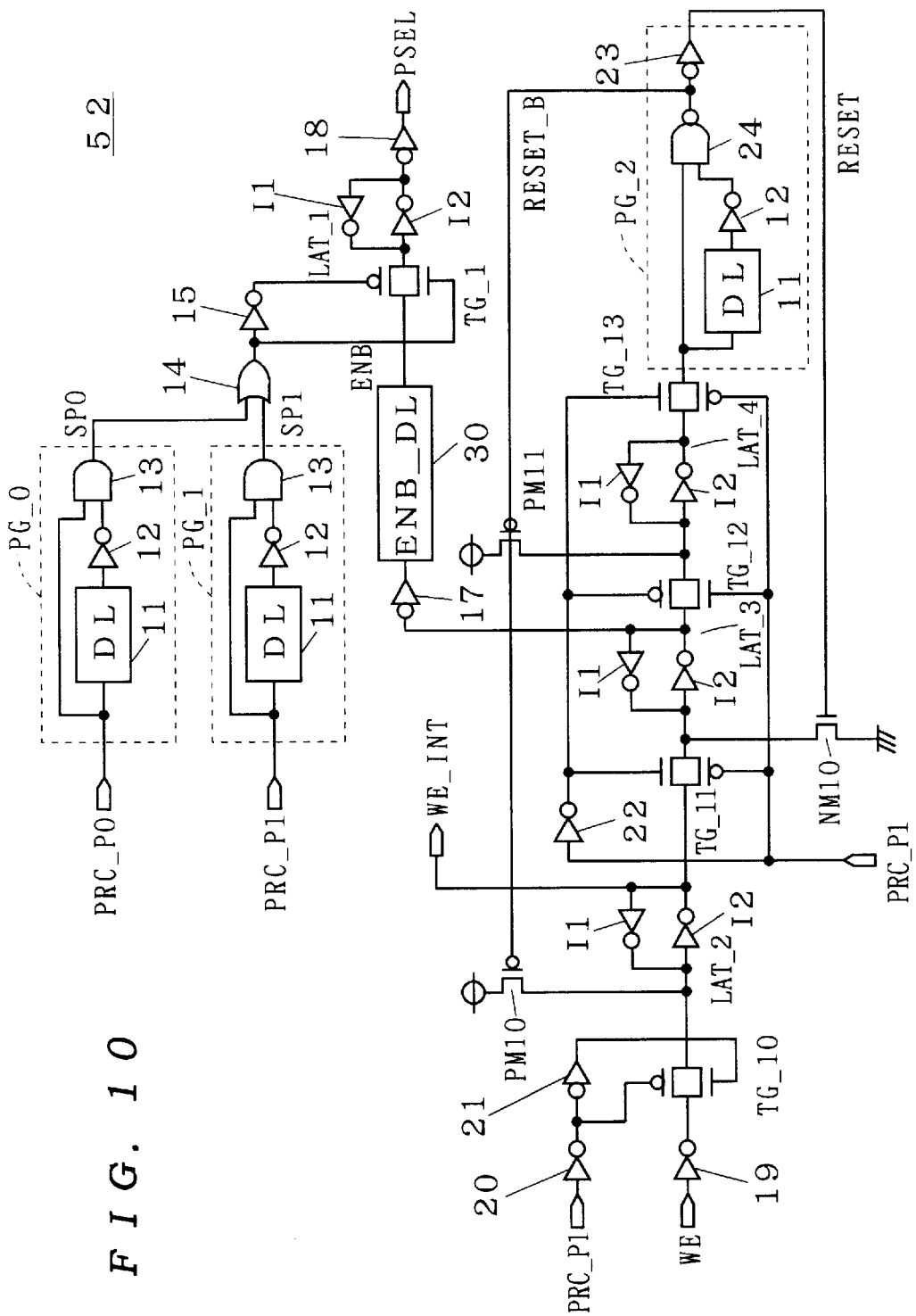
FIG. 10 is a circuit diagram showing the inside structure of a port exchange signal generating circuit of a third preferred embodiment.

FIG. 10 is a circuit diagram showing the structure of a port exchange signal generating circuit 52 according to the third preferred embodiment. As shown in this figure, a delay circuit 30 having a delay time DL is interposed between the inverter 17 and the transmission gate TG_1. In other respects, this structure is the same as that of the second preferred embodiment shown in FIG. 8.

Figure 11:
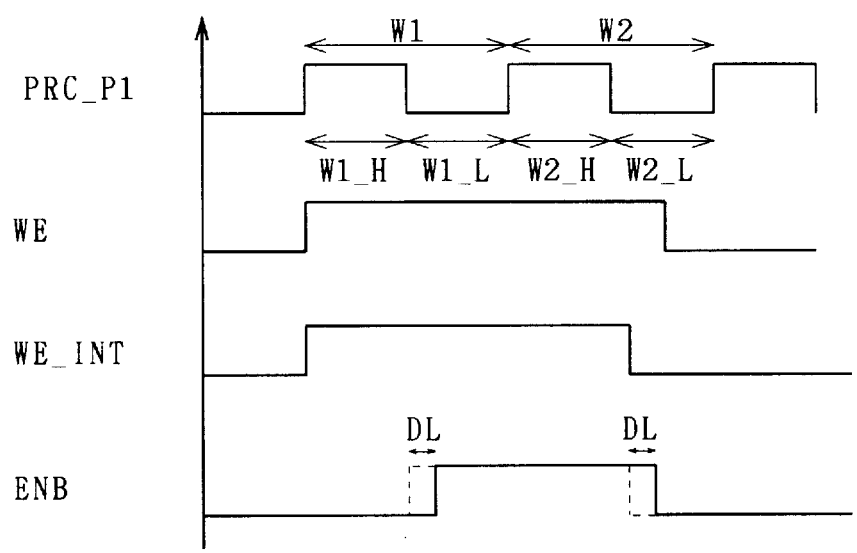
FIG. 11 is a timing chart showing operation of the port exchange signal generating circuit of FIG. 10.

FIG. 11 is a timing chart showing operation of the port exchange signal generating circuit 52 of the third preferred embodiment. In this figure, the part of the port exchange enable signal ENB shown by the broken lines shows the waveform in the second preferred embodiment. In the third preferred embodiment, the port exchange enable signal ENB is delayed by the delay time DL. Accordingly, setting an adequate delay time DL as a period required for precharge of bit lines allows port exchange without malfunction, enabling highly stable write operation.

Fourth Preferred Embodiment

Figure 12:
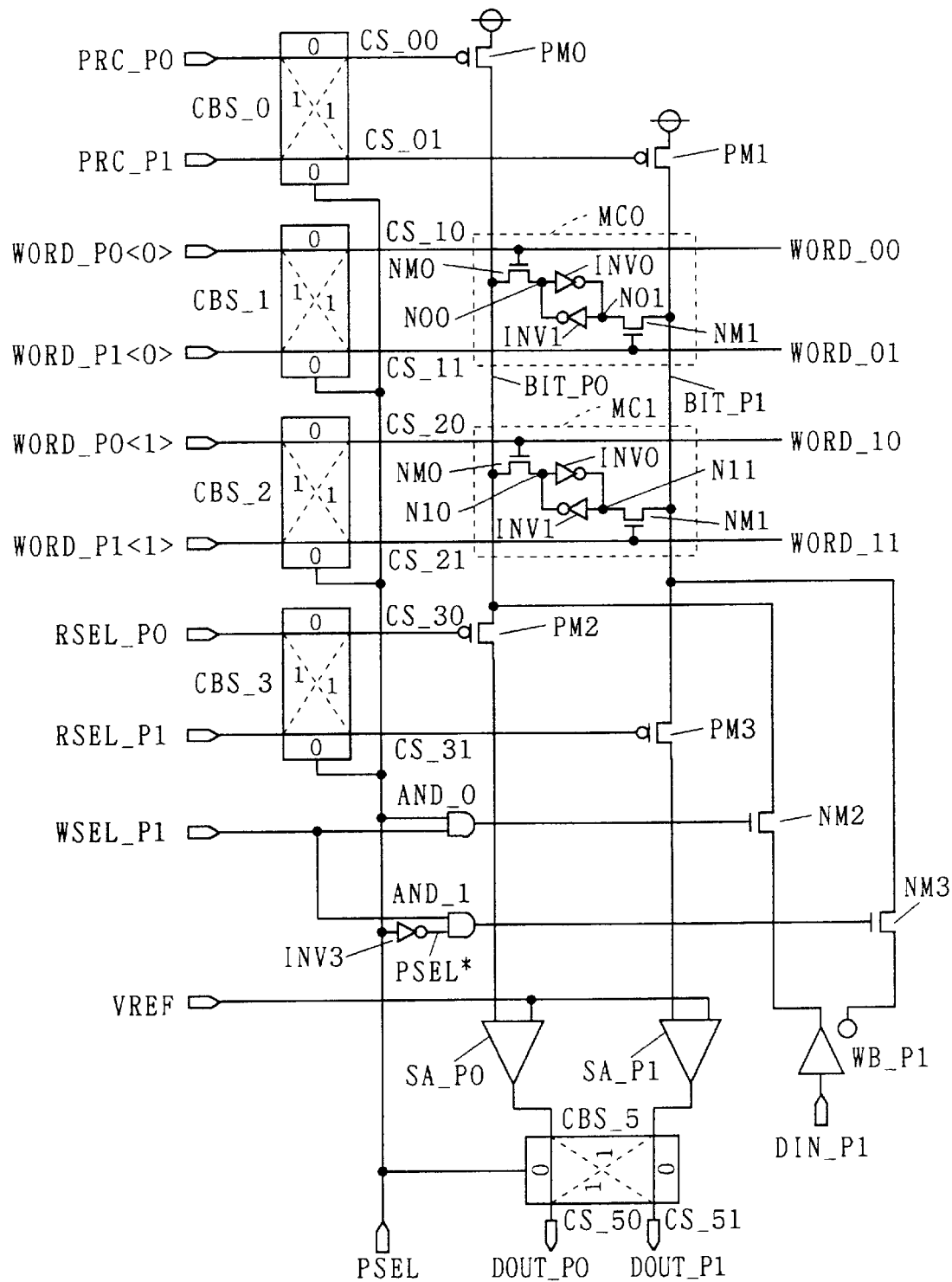
FIG. 12 is a circuit diagram showing the structure of a dual port memory according to a fourth preferred embodiment of the present invention.

FIG. 12 is a circuit diagram showing the structure of a dual port memory according to a fourth preferred embodiment of the present invention. As shown in this figure, it has AND gates AND_0 and AND_1 in place of the crossbar switch CBS_4 for the writing bit line selection signal WSEL_P1. That is to say, the AND gate AND_0 receives the writing bit line selection signal WSEL_P1 at its one input and receives the port exchange signal PSEL at its other input, and the AND gate AND_1 receives the writing bit line selection signal WSEL_P1 at its one input and receives at its other input the inversion port exchange signal PSEL* obtained as the port exchange signal PSEL passes through the inverter INV3.

Accordingly, when the port exchange signal PSEL is at an L level, the AND gate AND_0 is fixed at an L level and the writing bit line selection signal WSEL_P1 as an output of the AND gate AND_1 activates the NMOS transistor NM3, and then write is applied to the bit line BIT_P1. When the port exchange signal PSEL is at an H level, the AND gate AND_1 is fixed at an L level and the writing bit line selection signal WSEL_P1 as an output of the AND gate AND_0 activates the NMOS transistor NM2, and then write is applied to the bit line BIT_P0. The structure and operation are the same as those in the first preferred embodiment shown in FIG. 1 in other respects, so description thereof is not repeated here.

The crossbar switch CBS_4 is composed of four transmission gates as shown in FIG. 3. A transmission gate generally has no load driving force, so that a driver is required after it to provide a driving force in actual design. On the other hand, the AND gate having a driving force eliminates the need of separately providing such a driver, enabling higher speed.

Fifth Preferred Embodiment

In the dual port memory of the first preferred embodiment, the problem given below occurs when the cycle time of the precharge signal PRC_P0 is longer as compared with the precharge signal PRC_P1.

The problem will be described referring to the timing chart of FIG. 13. At the beginning of read operation of the zeroth port PORT_0, the port exchange enable signal ENB is at an L level and the zeroth port PORT_0 therefore performs reading using the bit line BIT_P0. Since the read period of the zeroth port PORT_0 is long, however, the second write cycle W2 starts in the middle and forces the bit line BIT_P0 to be handed over to the first port PORT_1. If the contents of the read operation of the zeroth port PORT_0 before that point has lowered the potential on the bit line BIT_P0, write may be erroneously applied to a write object memory cell which is different from the read object memory cell, selected for the writing.

Figure 13:
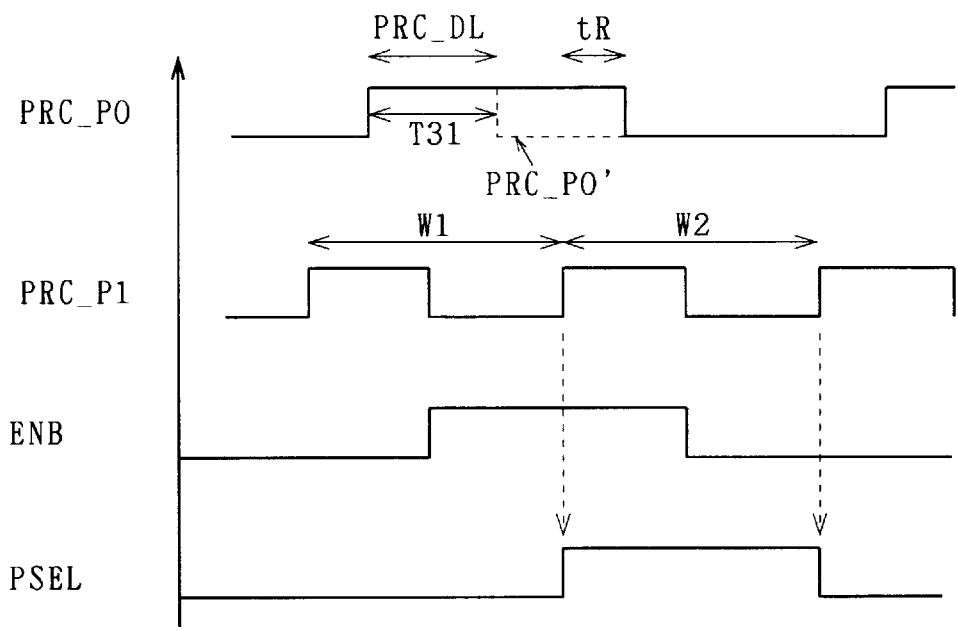
FIG. 13 is a timing chart for describing operation of a fifth preferred embodiment.

Furthermore, while the zeroth port PORT_0 must restart read operation after the ports are switched, the time which the zeroth port PORT_0 can use for reading is limited to the period tR of FIG. 13. If the period tR is not sufficiently long, read operation can not be completed. Since the length of the period tR is relatively determined by relation between the precharge signal PRC_0 and the precharge signal PRC_P1, however, it is substantially impossible to determine the length of the period tR as a designer intends to.

In order to avoid the problem, read operation of the zeroth port PORT_0 must finish in a period half the operation cycle period of the first port PORT_1.

Figure 14:
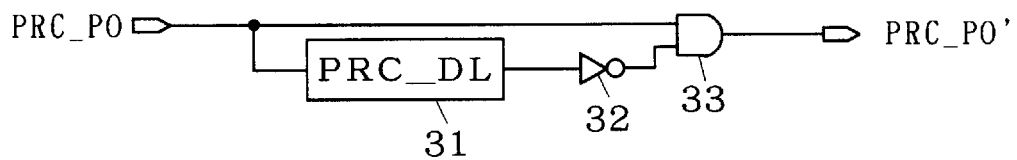
FIG. 14 is a circuit diagram showing the structure of a precharge signal transform circuit of the fifth preferred embodiment.

FIG. 14 is a circuit diagram showing the structure of a precharge signal transform circuit according to a fourth preferred embodiment of the present invention. As shown in this figure, a delay circuit 31 receives the precharge signal PRC_P0 and delays the signal for a time T31 and outputs it to an inverter 32. An AND gate 33 receives the precharge signal PRC_P0 at its one input and receives the output of the inverter 32 at its other input. It then outputs the output of the AND gate 33 as a precharge signal PRC_P0'. This precharge signal PRC_P0' is used instead of the precharge signal PRC_P0. At this time, the time T31 is set to half of the minimum period of the precharge signal PRC_P1 or shorter.

This structure waveform transforms the period of the H level of the precharge signal PRC_P0' to the delay time T31 of the delay circuit 31 as shown by the broken line in FIG. 13. Setting the active period of the zeroth port PORT_P0 to not more than ½ of the period of the precharge signal PRC_P1 ensures that the read operation of the zeroth port PORT_P0 is finished before the second write cycle W2 is started, which prevents erroneous writing and re-execution of reading and realizes normal operation.

Sixth Preferred Embodiment

In the dual port memory of the first preferred embodiment, the first and second amplify signals which are outputs of the sense amplifiers SA_P0 and SA_P1 are exchanged by the crossbar switch CBS_5 in order to cause read data of the zeroth port PORT_0 to be outputted to the output pin DOUT_P0 in the second write cycle W2. In this period, however, the first port PORT_1 is in the write cycle and it is not necessary to externally output the output signal DOUT_P1.

FIG. 15 is a circuit diagram showing the structure of a portion around sense amplifiers of a dual port memory according to a sixth preferred embodiment of the present invention. TG_20–TG_22 are transmission gates, LAT_P0 and LAT_P1 are latches each composed of a loop connection of inverters I1 and I2. The internal write enable signal WE_INT is, as shown in the second preferred embodiment of FIG. 8, an internal signal used for generation of the writing bit line selection signal WSEL_P1, which is at the H level from the beginning of the first write cycle W1 to the first half of the second write cycle W2 as shown in FIG. 9.

As shown in FIG. 15, an AND gate 34 receives an inversion signal of the internal write enable signal WE_INT and an inversion signal of the port exchange signal PSEL and provides an output to an inverter 35. An output of the inverter 35 is applied to the PMOS gate of the transfer gate TG_21 and also applied to an input of an inverter 36. An output of the inverter 36 is applied to the NMOS gate of the transfer gate TG_21.

The port exchange signal PSEL is applied to the PMOS gate of the transfer gate TG_20 and also applied to the inputs of inverters 37 and 38. An output of the inverter 38 is applied to the NMOS gate of the transfer gate TG_20. An output of the inverter 37 is applied to the PMOS gate of the transfer gate TG_22 and also applied to an input portion of an inverter 39. An output of the inverter 39 is applied to the NMOS gate of the transfer gate TG_22.

The transfer gate TG_20 is interposed between the output portion of the sense amplifier SA_P0 and the latch circuit LAT_P0, where the output of the latch circuit LAT_P0 is applied to an inverter 40 and an output of the inverter 40 is outputted as the output signal DOUT_P0. The transfer gate TG_21 is interposed between the output portion of the sense amplifier SA_P1 and the latch circuit LAT_P1, the output of the latch circuit LAT_P1 being applied to an inverter 41 and the output of the inverter 41 being outputted as the output signal DOUT_P1. Furthermore, the transfer gate TG_22 is interposed between the output portion of the sense amplifier SA_P1 and the latch circuit LAT_P0. In other respects, the structure is the same as the circuit structure of the first preferred embodiment.

In such a structure, in the read cycle in which the port exchange signal PSEL and the internal write enable signal WE_INT are both at the L level, the transfer gates TG_20 and TG_21 turn on and the transfer gate TG_22 turns off, so that the first amplify signal which is an output of the sense amplifier SA_P0 is selected as the output signal DOUT_P0 of the zeroth port PORT_0 and the second amplify signal which is an output of the sense amplifier SA_P1 is selected as the output signal DOUT_P1 of the first port PORT_1.

In the write period, the internal write enable signal WE_INT attains an H level and the transfer gate TG_21 always turns off independently of the port exchange signal PSEL. Before the ports are exchanged, the port exchange signal PSEL is at the L level, so that the transfer gate TG_20 turns on and the transfer gate TG_22 turns off, then the first amplify signal which is an output of the sense amplifier SA_P0 is selected as the output signal DOUT_P0 of the zeroth port PORT_0 and the read data of the previous time held at the latch circuit LAT_P1 is selected as the output signal DOUT_P1 of the first port PORT_1.

In the port exchanging period, the port exchange signal PSEL attains an H level and the transfer gate TG_22 turns on and the transfer gate TG_20 turns off. Then the second amplify signal which is an output of the sense amplifier SA_P1 is selected as the output signal DOUT_P0 of the zeroth port PORT_0 and the read data of the previous time held in the latch circuit LAT_P1 is selected as the output signal DOUT_P1 of the first port PORT_1. While the first preferred embodiment which uses the crossbar switch CBS_5 for exchange of outputs of the sense amplifiers SA_P0 and SA_P1 requires four transmission gates, the structure of the sixth preferred embodiment can obtain desired operation with three transmission gates.

Moreover, the latch circuits LAT_P0 and LAT_P1 provided at outputs of the sense amplifiers SA_P0 and SA_P1 allow the previous read data to be continuously outputted as the output signal DOUT_P0 of the zeroth port PORT_0 or as the output signal DOUT_P1 of the first port PORT_1 even when each port is not in a read operation period.

While the invention has been described in detail, the foregoing description is in all aspects illustrative and not restrictive. It is understood that numerous other modifications and variations can be devised without departing from the scope of the invention.

I claim:

1. A semiconductor storage device, comprising:

a first port for reading only;

a second port for reading and writing;

first and second bit lines provided corresponding to said first and second ports, respectively;

a plurality of first and second word lines each provided corresponding to said first and second ports, respectively, said plurality of first and second word lines corresponding to each other in a one-to-one manner;

a plurality of memory cells, provided between said first and second bit lines said plurality of memory cells each having first and second nodes providing signals in a logically inverted relation to each other, wherein said first node is connected to said first bit line when the first word line corresponding to said first bit line, in said plurality of first word lines, is in an active state and said second node is connected to said second bit line when the second word line corresponding to said second bit line, in said plurality of second word lines, is in an active state;

a first sense amplifier connected to said first bit line for outputting a first amplify signal on the basis of a potential on said first bit line;

a second sense amplifier connected to said second bit line for outputting a second amplify signal on the basis of a potential on said second bit line; and write signal output means receiving an input signal from outside, for outputting, on the basis of said input signal, a write signal from an output portion and outputting from an inversion output portion an inversion write signal which is an logical inversion of said write signal;

wherein a write operation of said second port is accomplished by continuously performing first and second write cycles, wherein in said first write cycle, a first selection word line, which is one of said plurality of first word lines, is brought to an active state and said first amplify signal is provided as an output signal of said first port, and a second selection word line, which is one of said plurality of second word lines, is brought to an active state, the inversion output portion of said write signal output means and said second bit line are electrically connected, and said inversion write signal is applied to said second node of a write object memory cell connected to the second selection word line in an active state, in said plurality of memory cells; and in said second write cycle, the second word line corresponding to said first selection word line, in said plurality of second word lines, is brought to an active state and said second amplify signal is obtained as an output signal of said first port, and the first word line corresponding to said second selection word line, in said plurality of first word lines, is brought to an active state, the output portion of said write signal output means and said first bit line are electrically connected, and said write signal is applied to said first node of said write object memory cell.

2. The semiconductor storage device according to claim 1, wherein said first sense amplifier receives a reference potential, and detects and amplifies a potential difference between the potential on said first bit line and said reference potential to output said first amplify signal, and said second sense amplifier receives said reference potential, and detects and amplifies a potential difference between the potential on said second bit line and said reference potential to output said second amplify signal;

wherein a read operation of said second port is accomplished by carrying out a read cycle of bringing one of said plurality of first word lines to an active state and providing said first amplify signal as a read signal of said first port and bringing one of said plurality of second word lines to an active state and providing said second amplify signal as an output signal of said second port.

3. The semiconductor storage device according to claim 2, further comprising, port exchange signal generating means for generating a port exchange signal which takes a first state at least in a part of said first write cycle and takes a second state at least in a part of said second write cycle, and word line switching means receiving a plurality of first and second word line selection signals activating said plurality of first and second word lines in a one-to-one correspondence and said port exchange signal, for providing said plurality of first and second word line selection signals respectively to said plurality of first and second word lines when said port exchange signal is in said first state, and providing said plurality of first and second word line selection signals respectively to said plurality of second and first word lines when said port exchange signal is in said second state.

4. The semiconductor storage device according to claim 3, further comprising in-reading bit line switching means receiving first and second in-reading bit line selection signals and said port exchange signal, for controlling conduction/cutoff between said first and second bit lines and input portions of said first and second sense amplifiers respectively under control by said first and second in-reading bit line selection signals when said port exchange signal is in said first state, and controlling conduction/cutoff between said second and first bit lines and the input portions of said second and first sense amplifiers respectively under control by said first and second in-reading bit line selection signals when said port exchange signal is in said second state.

5. The semiconductor storage device according to claim 4, further comprising in-writing bit line switching means receiving an in-writing bit line selection signal and said port exchange signal, for controlling conduction/cutoff between said second bit line and the inversion output portion of said write signal output means under control by said in-writing bit line selection signal when said port exchange signal is in said first state and controlling conduction/cutoff between said first bit line and the output portion of said write signal output means under control by said in-writing bit line selection signal when said port exchange signal is in said second state.

6. The semiconductor storage device according to claim 5, further comprising output signal switching means receiving said first and second amplify signals and said port exchange signal, for outputting said first and second amplify signals respectively as output signals of said first and second ports when said port exchange signal is in said first state, and outputting said first and second amplify signals respectively as output signals of said second and first ports when said port exchange signal is in said second state.

7. The semiconductor storage device according to claim 6, further comprising precharge bit line switching means receiving said first and second precharge signals and said port exchange signal, for precharging said first and second bit lines to a predetermined potential under control by said first and second precharge signals when said port exchange signal is in said first state and precharging said second and first bit lines to said predetermined potential under control by said first and second precharge signals when said port exchange signal is in said second state.

8. The semiconductor storage device according to claim 7, wherein said word line switching means, said in-reading bit line switching means, said in-writing bit line switching means, said output signal switching means and said precharge bit line switching means are each composed of the same circuit structure of 2-input and 2-output receiving said port exchange signal as a control input.

9. The semiconductor storage device according to claim 7, wherein
said first and second precharge signals are signals having respective independent periods, wherein said read cycle in said first port is performed in synchronization with said first precharge signal and said read cycle and the first and second write cycles in said second port are preformed in synchronization with said second precharge signal,
said first and second precharge signals taking an inactive state in the first half of their respective periods and taking in the latter half an active state which indicates a precharge operation to said predetermined potential,
wherein said port exchange signal generating means receives a write enable signal indicating whether a write operation or not and said first and second precharge signals, sets a port exchange enable period including a period from a part of the latter half of said first write cycle to a part of the first half of said second write cycle when said write enable signal indicates a write operation, and is triggered by an edge change detection to an inactive state of said first or second precharge signal in said port exchange enable period to change said port exchange signal from said first state to said second state.

10. The semiconductor storage device according to claim 9, wherein said port exchange signal generating means sets said port exchange enable period starting at an edge change of said second precharge signal to an active state in said first write cycle and terminating at an edge change of said second precharge signal to an inactive state in said second write cycle.

11. The semiconductor storage device according to claim 9, wherein said port exchange signal generating means sets said port exchange enable period starting when a predetermined time has passed from an edge change of said second precharge signal to an active state in said first write cycle and terminating when said predetermined time has passed from an edge change of said second precharge signal to an inactive state in said second write cycle.

12. The semiconductor storage device according to claim 7, wherein
said word line switching means, said in-reading bit line switching means, said output signal switching means and said precharge bit line switching means are each formed of the same 2-input and 2-output circuit structure receiving said port exchange signal as a control input, and
said in-writing bit line switching means includes,
a first transistor interposed between the output portion of said write signal output means and said first bit line,
a second transistor interposed between the inversion output portion of said write signal output means and said second bit line,
a first logical circuit receiving said in-writing bit line selection signal and said port exchange signal, for outputting to a control electrode of said first transistor a first logic signal indicating conduction/cutoff on the basis of said in-writing bit line selection signal only when said port exchange signal indicates the second state, and
a second logical circuit receiving said in-writing bit line selection signal and said port exchange signal, for outputting to a control electrode of said second transistor a second logic signal indicating conduction/cutoff on the basis of said in-writing bit line selection signal only when said port exchange signal indicates the first state.

13. The semiconductor storage device according to claim 7, further comprising precharge signal waveform transforming means receiving said first precharge signal for waveform transforming a period of an inactive state of said first precharge signal to one-half of a period of said second precharge signal or shorter.

14. The semiconductor storage device according to claim 7, wherein said output signal switching means includes sense amplifier output cutting-off means receiving a write enable relating signal relating to said write enable signal for electrically cutting off an output portion of said second sense amplifier in writing.

15. The semiconductor storage device according to claim 14, wherein said output signal switching means further comprises first and second latch circuits respectively receiving said first and second amplify signals under control by said write enable relating signal and said port exchange signal.

16. A semiconductor storage device comprising:
first and second ports,
a plurality of memory cells each having first and second nodes providing signals in a logically inverted relation to each other,
a plurality of pairs of first and second word lines corresponding to said plurality of memory cells, a first bit line electrically connected to each first node of said plurality of memory cells when the first word line corresponding to each memory cell is activated, a second bit line electrically connected to each second node of said plurality of memory cells when the second word line corresponding to each memory cell is activated, a first switch circuit having first and second connection states which are switched alternately, for connecting said first bit line to said first port in said first connection state, and for connecting said second bit line to said first port in a second connection state, wherein said first port is capable of selectively outputting a signal stored in one of said plurality of memory cells through said first bit line when the corresponding first word line is activated, and a signal stored in one of said plurality of memory cells through said second bit line when the corresponding second word line is activated, write signal output means receiving an input data from said second port, for outputting respective write signals from said first and second output portions in response to said input data, said respective write signals being logical inversions of each other, and a write control circuit for connecting the first output portion of said write signal output means to said second bit line, a write signal from said first output portion applied to the second node of a memory cell corresponding to an activated one of said plurality of second word lines, in said first connection state of said first switch circuit, and connecting the second output portion of said write signal output means to said first bit line, a write signal from said second output portion applied to the first node of a memory cell corresponding to an activated one of said plurality of first word lines, in said second connection state of said first switch circuit.

17. The semiconductor storage device according to claim 16, wherein said first switch circuit connects said second bit line to said second port in said first connection state, and connects said first bit line to said second port in said second connection state, wherein said second port is capable of selectively outputting a signal stored in one of said plurality of memory cells through said second bit line with the corresponding second word line activated, and a signal stored in one of said plurality of memory cells through said first bit line with the corresponding first word line activated.

18. The semiconductor storage device according to claim 17, further comprising:

a first sense amplifier coupled to said first bit line and said first switch circuit, for amplifying a potential difference between the potential on said first bit line and a reference potential, to output the amplified signal to said first switch circuit as a read data from said first bit line, and a second sense amplifier coupled to said second bit line and said first switch circuit, for amplifying a potential difference between the potential on said second bit line and said reference potential, to output the amplified signal to said first switch circuit as a read data from said second bit line.

19. The semiconductor storage device according to claim 16, wherein said first switch circuit switches said first and second connection states in accordance with a switch signal, and said write control circuit includes:

a first transistor connected between the first portion of said write signal output means and said second bit line, a second transistor connected between the second portion of said write signal output means and said first bit line, and a selection circuit receiving a write selection signal, for selectively applying said write selection signal to an electrode of said first transistor or to an electrode of said second transistor, based on said switch signal, wherein said first transistor is conducted in said first connection state of said first switch circuit, and said second transistor is conducted in said second connection state of said first switch circuit.

20. The semiconductor storage device according to claim 16, wherein said first switch circuit switches said first and second connection states in accordance with a switch signal, said device further comprising:

a plurality of second switch circuits corresponding to said plurality of memory cells, each said second switch circuit receiving said switch signal and a word line activation signal, each said second switch circuit providing said word line activation signal for a selected one of the corresponding first and second word lines, the selected word line being activated, in accordance with said switch signal, wherein said word line activation signal is provided for said plurality of second switch circuits selectively.

21. The semiconductor storage device according to claim 16, wherein said first switch circuit switches said first and second connection states in accordance with a switch signal, said device further comprising:

a plurality of second switch circuits provided corresponding to said plurality of memory cells and each receiving said switch signal and first and second word line activation signals for activating the corresponding said first and said second word lines, each providing said first and second word line activation signals for the corresponding first and second word lines, respectively, when said first switch circuit is in said first connection state, and for providing said first and second word line activation signals for the corresponding second and first word lines, respectively, when said first switch circuit is in said second connection state, in accordance with said switch signal, wherein said first word line activation signal is provided for said plurality of second switch circuits selectively, to read out the signal stored in a selected one of said plurality of memory cells to said first port through one of said first and second bit lines selected by said first switch circuit, and said second word line activation signal is provided for said plurality of second switch circuits selectively, to write said input signal from said second port into a selected one of said plurality of memory cells through one of said first and second bit lines selected by said write control circuit.

* * * * *

UNITED STATES PATENT AND TRADEMARK OFFICE
CERTIFICATE OF CORRECTION

PATENT NO. : 5,774,410
DATED : June 30, 1998
INVENTOR(S) : Yasunobu NAKASE

It is certified that error appears in the above-identified patent and that said Letters Patent is hereby corrected as shown below:

Column 27, line 12, change "a second" to --said second--;
    line 21, change "said first and second" to --first and second--.

Signed and Sealed this

Twentieth Day of July, 1999

Attest:

Q. TODD DICKINSON

Attesting Officer

Acting Commissioner of Patents and Trademarks